United States Patent
Onchuck

(10) Patent No.: US 9,342,634 B2
(45) Date of Patent: *May 17, 2016

(54) DORMER CALCULATOR

(71) Applicant: Dean Onchuck, Mooreton, ND (US)

(72) Inventor: Dean Onchuck, Mooreton, ND (US)

( * ) Notice: Subject to any disclaimer, the term of this patent is extended or adjusted under 35 U.S.C. 154(b) by 512 days.

This patent is subject to a terminal disclaimer.

(21) Appl. No.: 13/890,334

(22) Filed: May 9, 2013

(65) Prior Publication Data

US 2013/0275093 A1    Oct. 17, 2013

Related U.S. Application Data

(60) Division of application No. 12/902,313, filed on Oct. 12, 2010, which is a continuation-in-part of application No. 11/043,802, filed on Jan. 26, 2005, now Pat. No. 7,813,902.

(60) Provisional application No. 60/592,597, filed on Jul. 30, 2004.

(51) Int. Cl.
| | |
|---|---|
| *G06G 7/48* | (2006.01) |
| *G06F 17/50* | (2006.01) |
| *E04B 7/06* | (2006.01) |
| *E04B 7/18* | (2006.01) |
| *E04D 15/00* | (2006.01) |

(52) U.S. Cl.
CPC .............. *G06F 17/5004* (2013.01); *E04B 7/06* (2013.01); *E04B 7/18* (2013.01); *E04D 15/00* (2013.01)

(58) Field of Classification Search
CPC ........... E04B 7/18; E04B 7/24; E04B 1/2608; E04B 1/24; E04D 13/1407; E04D 13/10; E04C 3/17; G06Q 30/06
See application file for complete search history.

(56) References Cited

U.S. PATENT DOCUMENTS

| | | | |
|---|---|---|---|
| 3,596,068 A | 7/1971 | Doyle | |
| 3,860,803 A | 1/1975 | Levine | |
| 4,516,363 A * | 5/1985 | Beaulieu | E04C 3/17 52/198 |
| 4,551,810 A | 11/1985 | Levine | |
| 4,847,778 A | 7/1989 | Daley | |
| 4,912,657 A | 3/1990 | Saxton | |
| 6,446,053 B1 | 9/2002 | Elliott | |
| 6,510,666 B1 * | 1/2003 | Thompson | E04B 1/2608 52/264 |
| 6,628,279 B1 | 9/2003 | Schell et al. | |
| 6,681,530 B1 * | 1/2004 | Givens | E04D 13/407 108/16 |
| 6,766,282 B1 | 7/2004 | Schettine | |

(Continued)

OTHER PUBLICATIONS

Craig Thomas, Avatech Tricks: Creating Dormer Roofs in Revit Building, Jan. 12, 2006, http://www.cadalyst.com/aec/avatech-tricks-creating-dormer-roofs-revit-building-5405.

(Continued)

*Primary Examiner* — Kandasamy Thangavelu
(74) *Attorney, Agent, or Firm* — Kinney & Lange, P.A.

(57) ABSTRACT

A method is disclosed for laying out a dormer that projects outward from a main roof and has a gable end and a dormer roof originating at a dormer point and terminating at an outer edge of the dormer roof near the gabled end. The dormer includes roof sheathing supported by dormer trusses. The dormer trusses include a gable truss and a plurality of valley trusses. The method includes receiving a plurality of dormer inputs from a user. A plurality of layouts for the roof sheathing on the dormer roof are generated as a function of the dormer inputs. One or more layouts are then recommended to a user to reduce a quantity of roof sheathing waste.

13 Claims, 34 Drawing Sheets

(56) References Cited

U.S. PATENT DOCUMENTS

| | | | |
|---|---|---|---|
| 7,813,902 B2 * | 10/2010 | Onchuck | E04B 7/18 703/1 |
| 2002/0066256 A1 | 6/2002 | Oberpriller et al. | |
| 2004/0073410 A1 | 4/2004 | Maly et al. | |
| 2004/0103597 A1 * | 6/2004 | Ellenberger | E04B 7/24 52/90.2 |
| 2005/0102958 A1 * | 5/2005 | Anderson | E04D 13/10 52/698 |
| 2005/0108982 A1 * | 5/2005 | Formisano | G06Q 30/06 52/741.1 |
| 2006/0174551 A1 * | 8/2006 | Bartels | E04B 1/24 52/90.1 |

OTHER PUBLICATIONS

Victorian Shed Kit Assembly Instructions, Lancasterbarns.com, Apr. 10, 2006, http://www.lancasterbarns.com/acatalog/AssemblyInstructions-T1-11&Vinyl.pld (11 pages).

Victorian Shed Kit Assembly Instructions, Lancasterbarns.com, Apr. 10, 2006, http://www.lancasterbarns.com/acatalog/AssemblyInstructions-T1-11&Vinyl.pld (metadata 1 page).

\* cited by examiner

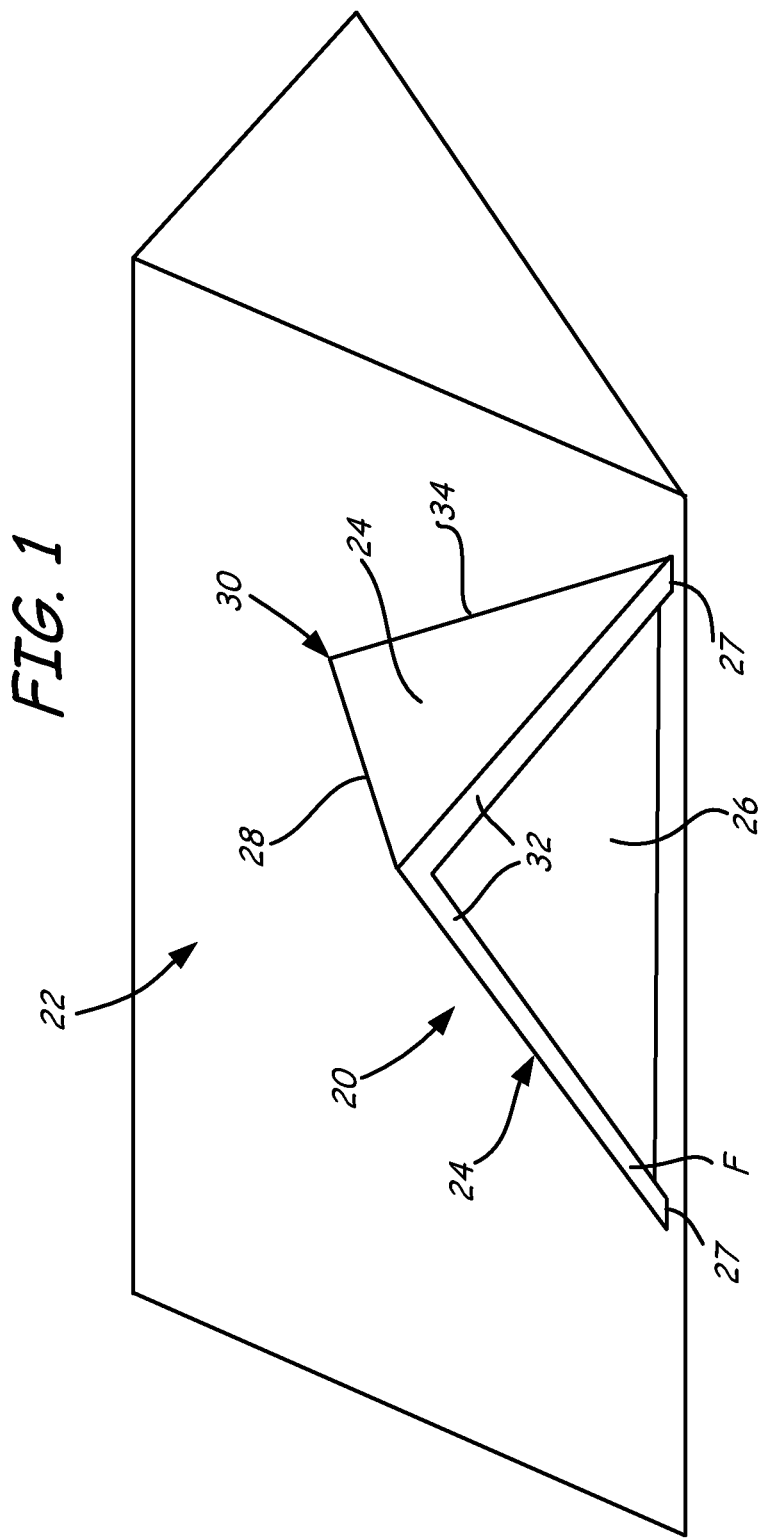

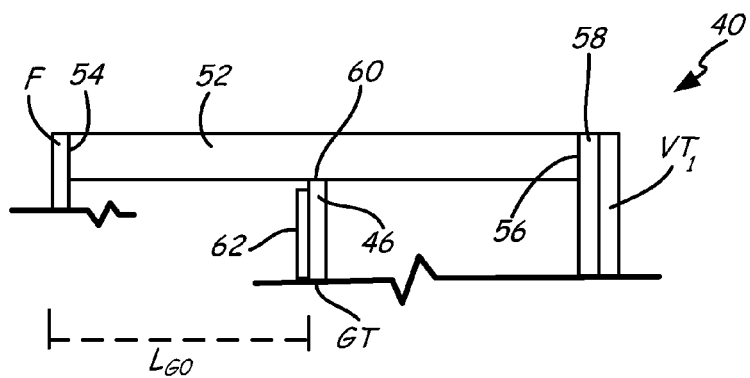
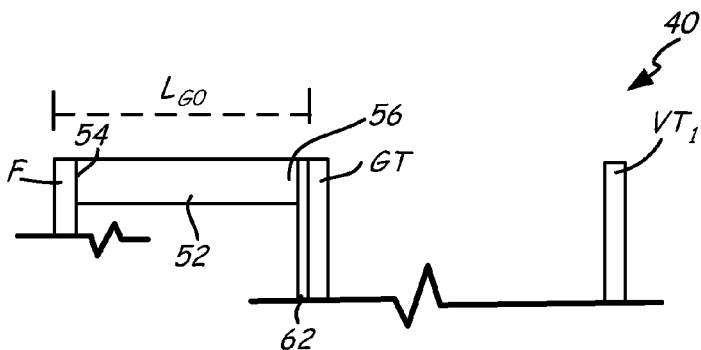
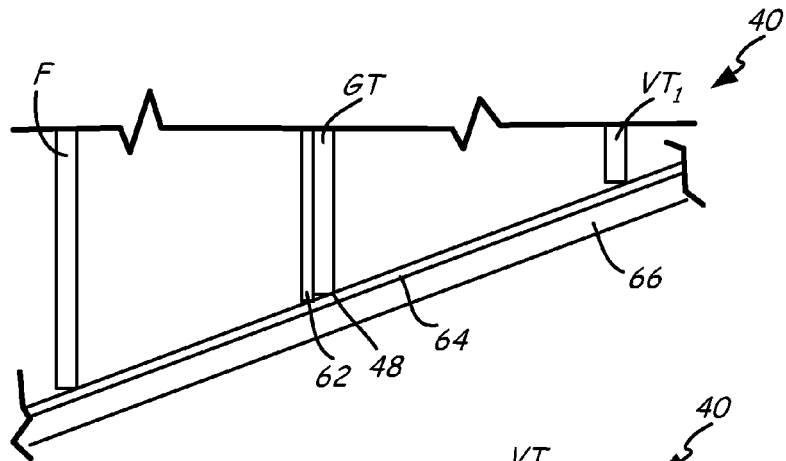
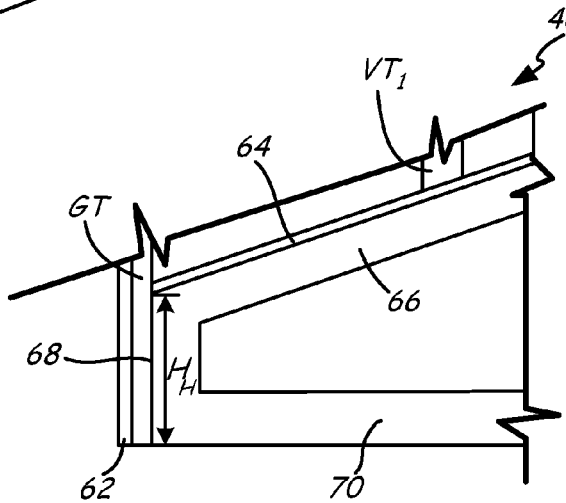

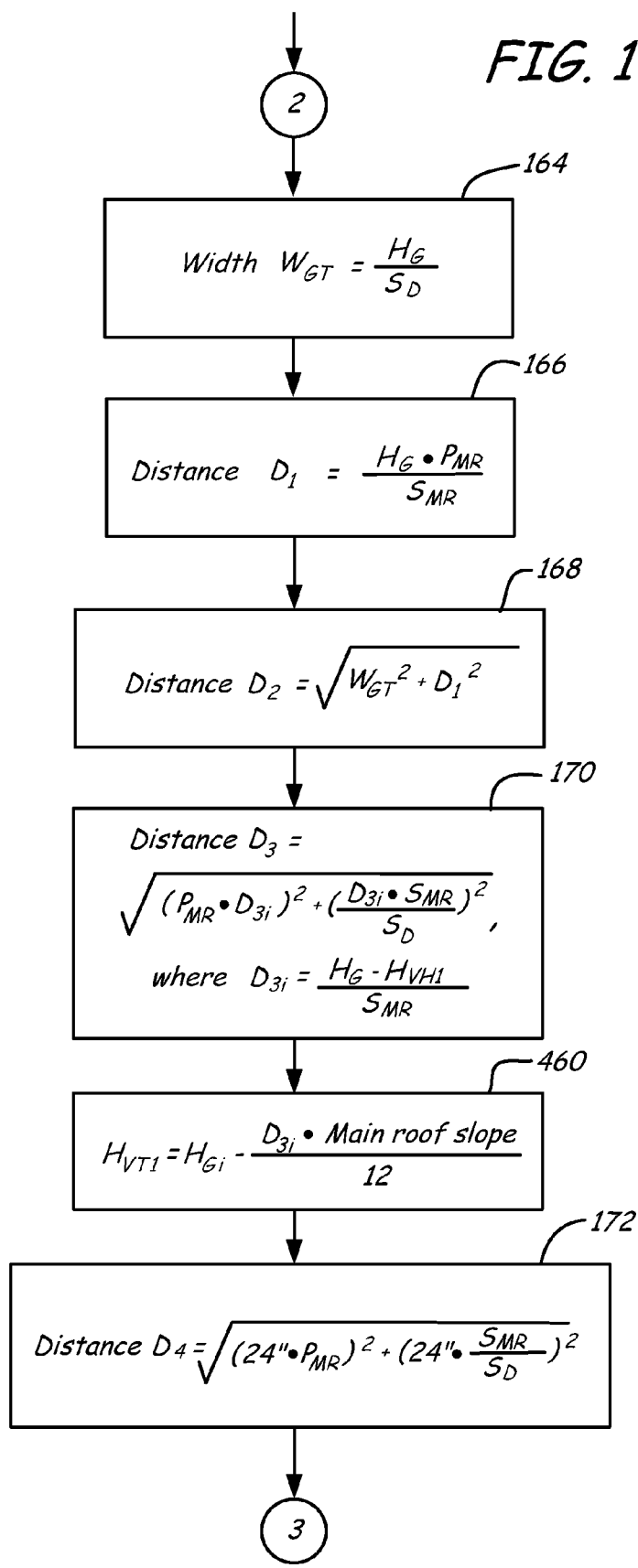

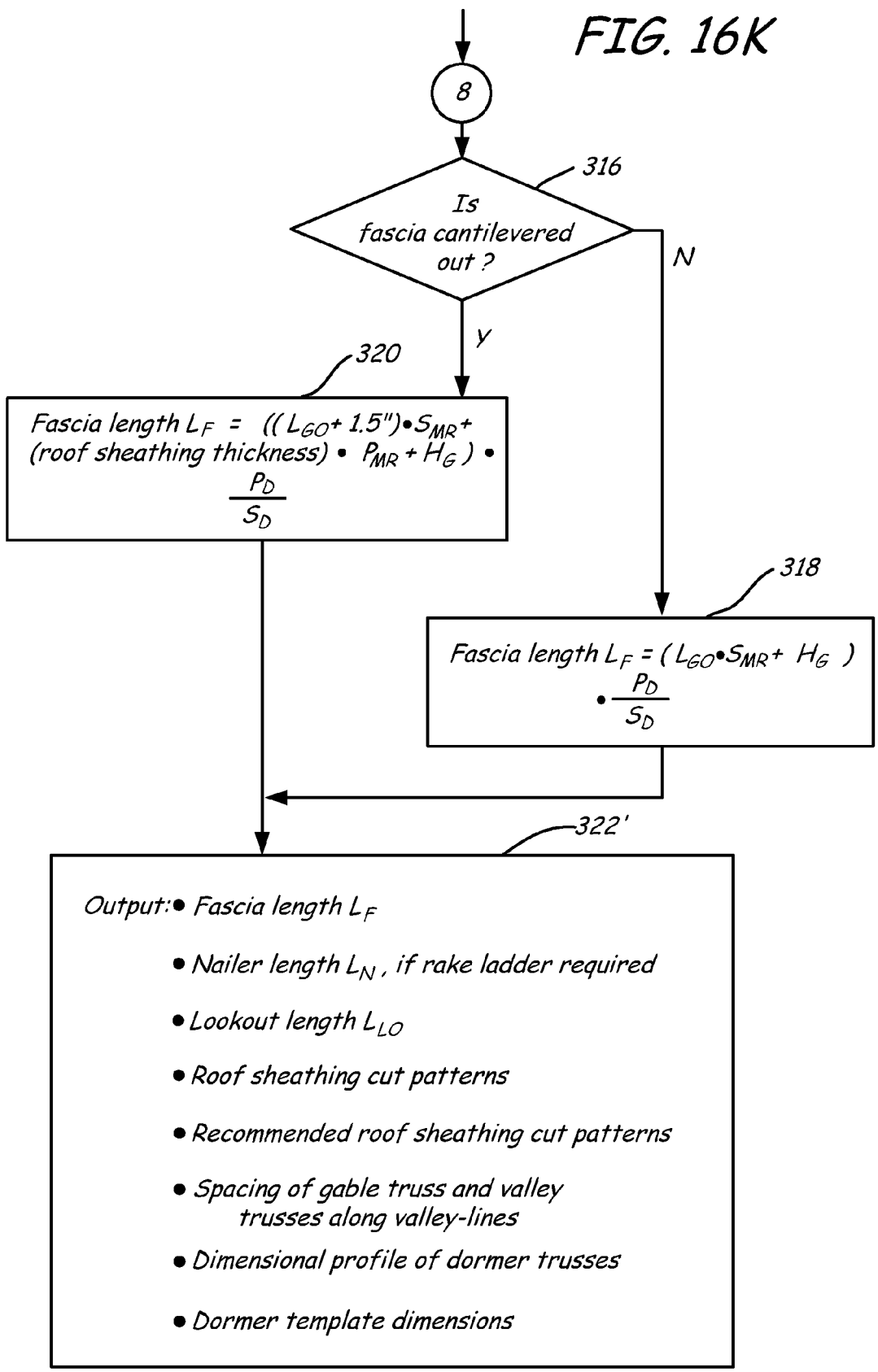

DORMER CALCULATOR

CROSS-REFERENCE TO RELATED APPLICATION(S)

This application is a division of U.S. application Ser. No. 12/902,313 filed Oct. 12, 2010 for "DORMER CALCULATOR" by D. Onchuck, which in turn is a continuation-in-part of U.S. application Ser. No. 11/043,802 filed Jan. 26, 2005 for "DORMER CALCULATOR" by Dean Onchuck, which in turn claims the benefit of Provisional Application No. 60/592,597 filed on Jul. 30, 2004 by Dean Onchuck and entitled "DORMER CALCULATOR."

INCORPORATION BY REFERENCE

The aforementioned U.S. application Ser. Nos. 12/902,313 and 11/043,802 and Provisional Application No. 60/592,597 are hereby incorporated by reference in their entirety.

BACKGROUND

The present invention relates generally to the field of dormer construction. In particular, the present invention relates to a method for laying out the materials for constructing a dormer.

A dormer is a roofed structure projecting outward from the sloping plane of a main roof. A dormer may be included in a roof to increase headroom, improve ventilation, provide a vertical surface suitable for installing windows or other openings, or to add to the aesthetic appeal of a building.

The framework of a dormer typically consists of a series of spaced trusses which support roof sheathing. These dormer trusses, commonly referred to as valley trusses, are available from suppliers in a pre-manufactured form. The trusses are typically uniformly spaced pursuant to industry standards such as, for example, twenty-four inches on center. The spacing of the outermost dormer truss, commonly referred to as a gable truss, and the first valley truss may deviate from the uniform spacing of the other trusses depending upon the particular dormer installation. The suppliers of pre-manufactured trusses typically do not provide the installer with the appropriate spacing for the gable truss and the first valley truss.

Even when using pre-manufactured trusses, laying out dormers is a time-consuming endeavor that requires a significant amount of expertise. Frequently, a dormer installer spends significant amounts of time on the roof measuring and making roof sheathing placement and cutting decisions. Traditional practices for laying out dormer roof sheathing can involve guesswork that may result in wasted material, lengthy exposure times on the roof, and a hazard of material waste dropped from the roof. As such, there exists a need for an improved method for laying out dormer truss locations and dormer roof sheathing.

SUMMARY

The present invention is a method for laying out a dormer that projects outward from a main roof. The dormer has a gabled end and a dormer roof originating at a dormer point and terminating at an outer edge of the dormer roof near the gabled end. The dormer includes roof sheathing supported by dormer trusses. The dormer trusses include a gable truss and a plurality of valley trusses.

In one embodiment, the method of the present invention includes receiving a plurality of dormer inputs from a user. A plurality of layouts for the roof sheathing on the dormer roof are generated as a function of the dormer inputs. At least on roof sheathing layout is then recommended to a user.

In another embodiment, the method of the present invention includes receiving a plurality of dormer inputs from a user. The dormer inputs are processed to generate a gable truss spacing for spacing the gable truss from a first valley truss and a uniform valley truss spacing for spacing neighboring valley trusses from each other. The location of the dormer trusses are then determined using the gable truss spacing and the uniform valley truss spacing. The location of each dormer truss is then displayed to a user.

BRIEF DESCRIPTION OF THE DRAWINGS

FIG. 1 is a perspective view of an embodiment of a dormer projecting outward from a main roof.

FIG. 3 is a partial side view of an embodiment of the dormer framing of FIG. 2A with a rake ladder detail for attaching a fascia to the dormer framing.

FIG. 4 shows a partial side view of an embodiment of the dormer framing of FIG. 2A with a conventional lookout attaching a fascia to the dormer framing.

FIG. 5 shows a partial side view of a conventional technique for attaching a fascia and a gable truss of the dormer framing of FIG. 2A to the main roof.

FIG. 6 shows a partial side view of an embodiment of the dormer framing of FIG. 2A, wherein the dormer framing has a gable truss with a heel height.

FIGS. 16A-16K are flow diagrams illustrating an embodiment of the calculation process of FIG. 15.

Figure 2A:
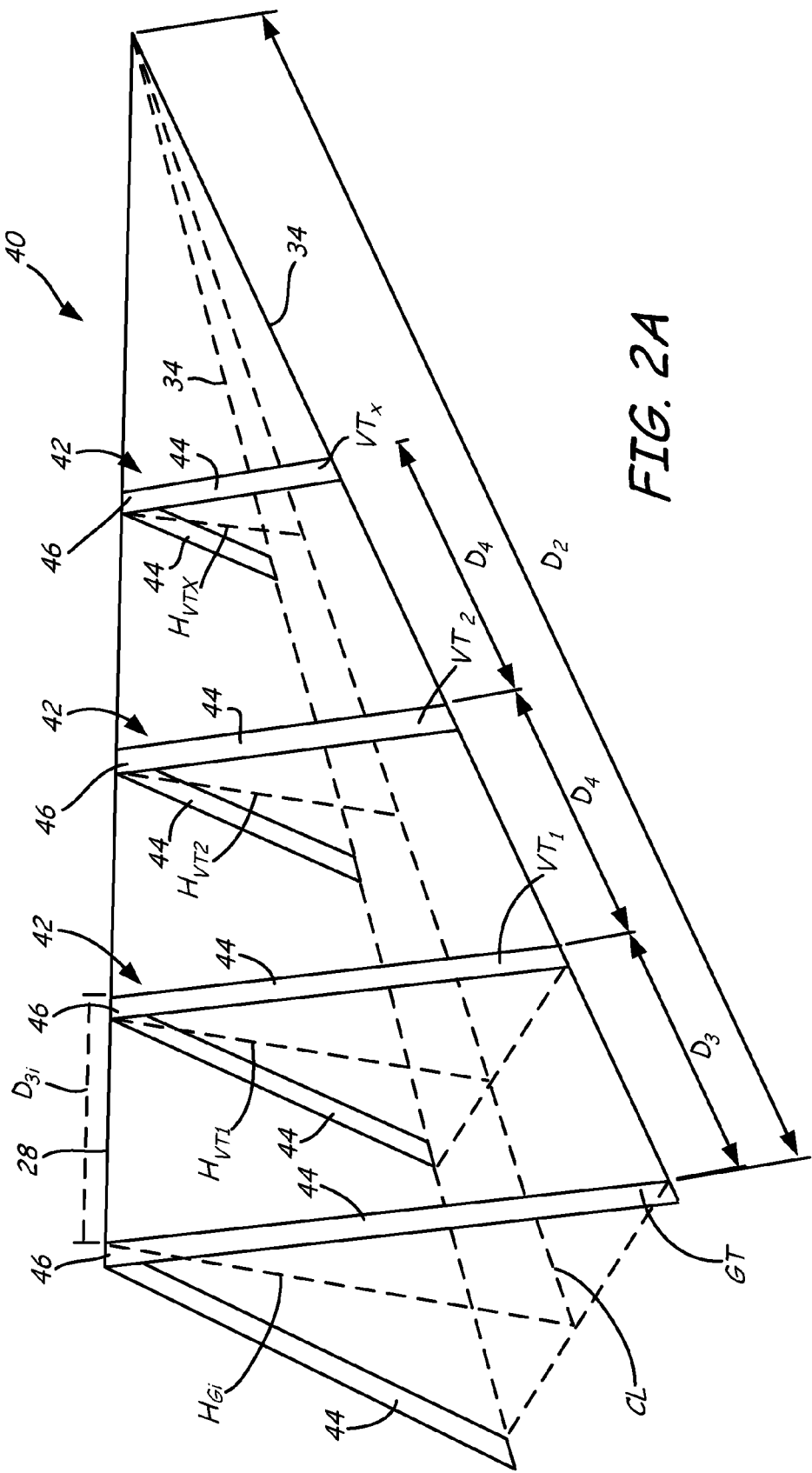
FIG. 2A is a simplified perspective view of dormer framing for use in constructing the dormer of FIG. 1.

While the above-identified drawing figures set forth several embodiments of the invention, other embodiments are also contemplated, as noted in the discussion. In all cases, this disclosure presents the invention by way of representation and not limitation. It should be understood that numerous other modifications and embodiments can be devised by those skilled in the art that fall within the scope and spirit of the principles of the invention. The figures may not be drawn to scale. Like reference numbers have been used throughout the figures to denote like parts.

DETAILED DESCRIPTION

FIG. 1 is a perspective view of dormer 20 projecting outward from main roof 22. Main roof 22 encloses a primary roofed-in area and dormer 20 encloses a secondary roofed-in area. Dormer 20 includes dormer roof 24, fascia F, gabled end 26, and ridgeline 28 formed in dormer roof 24. Ridgeline 28 originates at dormer point 30, extends along dormer roof 24, and terminates at edge 32 of dormer roof 24 near fascia F. Fascia F has two bottom ends 27, which in dormer 20 of FIG. 1 attach to main roof 22. A pair of valley-lines 34, only one of which is visible in FIG. 1, are located at the intersection of main roof 22 and dormer roof 24. Valley-lines 34 extend outward from dormer point 30 and terminate at edge 32.

As shown in FIG. 1, both main roof 22 and dormer roof 24 are sloped. Main roof 22 has a main roof slope $S_{MR}$ representing an amount of vertical rise of main roof 22 per an amount of horizontal run of main roof 22. Similarly, dormer roof 24 has a dormer slope $S_D$ representing an amount of vertical rise of dormer roof 24 per an amount of horizontal run of dormer roof 24.

Figure 2B:
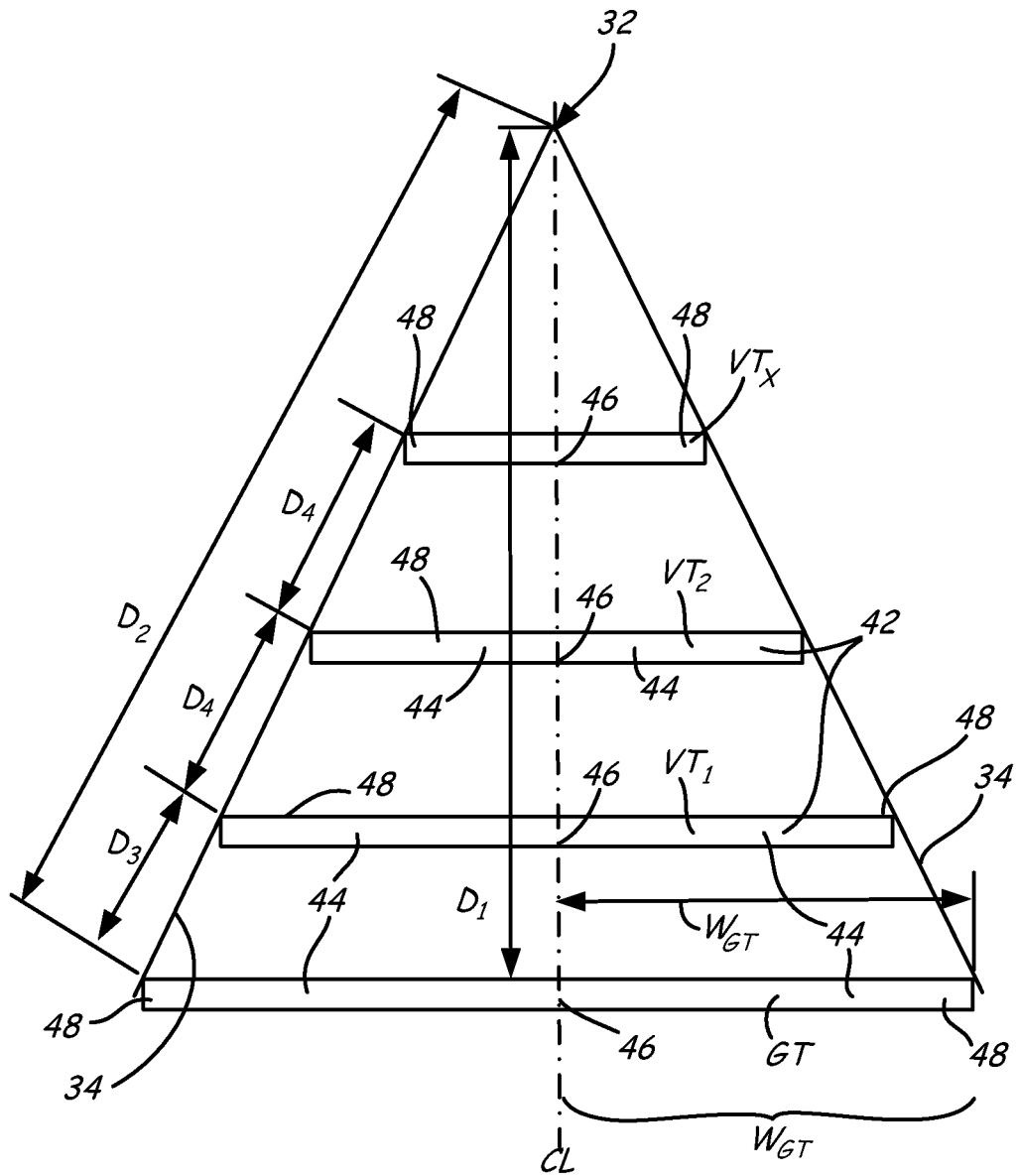
FIG. 2B shows a top view of the dormer framing of FIG. 2A.

FIGS. 2A and 2B are simplified views of dormer framing 40 for supporting dormer roof 24 and gabled end 28 of dormer 20, with FIG. 2A showing a simplified perspective view of dormer framing 40 and FIG. 2B showing a simplified top view of dormer framing 40. Dormer framing 40 includes gable truss GT and valley trusses 42, which are each centered on centerline CL located along main roof 22 equidistant to valley-lines 34. Gable truss GT and valley trusses 42 each include a pair of rafters 44 joined at truss peak 46 and having ends 48 for attachment to main roof 22. Depending upon the size and structural requirements for a particular dormer 20, the number of valley trusses 42 may vary from a single valley truss 42 to any number, x, of valley trusses $VT_1$ through $VT_x$. Gable truss GT has truss height $H_{Gi}$ and a truss width $W_{GT}$. Each valley truss 42 has a different truss height $H_{VTx}$. Gable truss GT is the outermost truss relative to dormer point 30, height $H_{Gi}$ is larger than any height $H_{VTx}$. As shown in FIG. 2, the closer a particular valley truss $VT_x$ is located to gable truss GT, the greater its height $H_{VTx}$ and, conversely, the further a particular valley truss $VT_x$ is located from gable truss GT, the less its height $H_{VTx}$.

Gable truss GT is spaced from dormer point 30 along centerline CL by distance $D_1$ and from dormer point 30 along valley-line 34 by distance $D_2$. In addition, gable truss GT is spaced from valley truss $VT_1$ along ridgeline 28 by distance $D_{3i}$ and from valley truss $VT_1$ along valley-line 34 by distance $D_3$. Valley trusses 42 are spaced from each other along valley-line 34 by distance $D_4$. As shown in FIG. 2, distances $D_2$, $D_3$, and $D_4$ are each measured from an inside edge (relative to dormer point 30) of each respective truss. Depending upon the particular configuration of dormer 20, distance $D_3$ and $D_4$ may be the same, distance $D_3$ may be less than distance $D_4$, or distance $D_3$ may be greater than distance $D_4$. In some embodiments, distance $D_4$ is fixed in accordance to construction conventions, such as, for example, twenty-four inches on center for standard wood framing techniques. Distance $D_4$ may vary from one dormer to another, depending upon the materials and construction conventions used to construct each dormer.

Multiple framing variations are employed in the dormer construction industry for attaching fascia F to dormer framing 40. FIGS. 3 and 4 are partial side views of two different embodiments for attaching fascia F to dormer framing 40 of dormer 20, with FIG. 3 showing dormer framing 40 with a rake ladder detail and FIG. 4 showing dormer framing 40 without a rake ladder detail. As shown in FIG. 3, fascia F attaches to lookout 52 at outer end 54 of lookout 52. Fascia F is made of two pieces and each piece has a fascia length $L_F$ (not shown in FIGS. 3 and 4). Inner end 56 of lookout 52 attaches to nailer 58 and middle portion 60 of lookout 52 attaches to truss peak 46 of gable truss GT. Nailer 58 attaches to valley truss $VT_1$ and extends along each rafter 44 of valley truss $VT_1$ to secure lookout 52 relative to valley truss $VT_1$. Nailer 58 is formed from two pieces, with each piece having a nailer length $L_N$ (not shown in FIG. 3). Wall sheathing 62 is attached to gable truss GT to form gable end 28.

As mentioned above, FIG. 4 shows dormer framing 40 without a rake ladder detail. Similar to the embodiment of FIG. 3 (that includes a rake ladder detail), fascia F attaches to outer end 54 of lookout 52. However, in the embodiment of FIG. 4, lookout 52 is shorter and attaches at inner end 56 to wall sheathing 62 secured to gable truss GT.

As shown in FIGS. 3 and 4, each embodiment of dormer framing 40 has a gable overhang length $L_{GO}$ that is equal to the distance between gable truss GT and an outside face of fascia F. Thus, length $L_{GO}$ indicates the distance the outside face of fascia F is spaced out from gable truss GT.

Multiple framing variations are also employed in the dormer construction industry for attaching fascia F at its two bottom ends 27 (FIG. 1) to support structures such as, for example, dormer framing 40 or main roof 22. In some embodiments, bottom ends 27 of fascia F may be secured directly to main roof 22 or a component of main roof 22, while in other embodiments bottom ends 27 may be secured to a support cantilevered out from the building fascia of main roof 22.

FIGS. 5 and 6 are partial side views of two framing variations for dormer framing 40 used in the dormer construction industry for securing gable truss GT relative to main roof 22. As shown in FIG. 5, ends 48 of gable truss GT are secured to main roof sheathing 64 of main roof 22, which is attached to main roof support 66 of main roof 22. In other embodiments of dormer framing 40, ends 48 of gable truss GT may be secured directly to main roof supports 66. In FIG. 6, side portion 68 of gable truss GT is secured to building support 70 of main roof 22. As shown in FIG. 6, gable truss GT has heel height $H_H$ which equals the length of the portion of height $H_{Gi}$ that extends below main roof sheathing 64.

Figure 7:
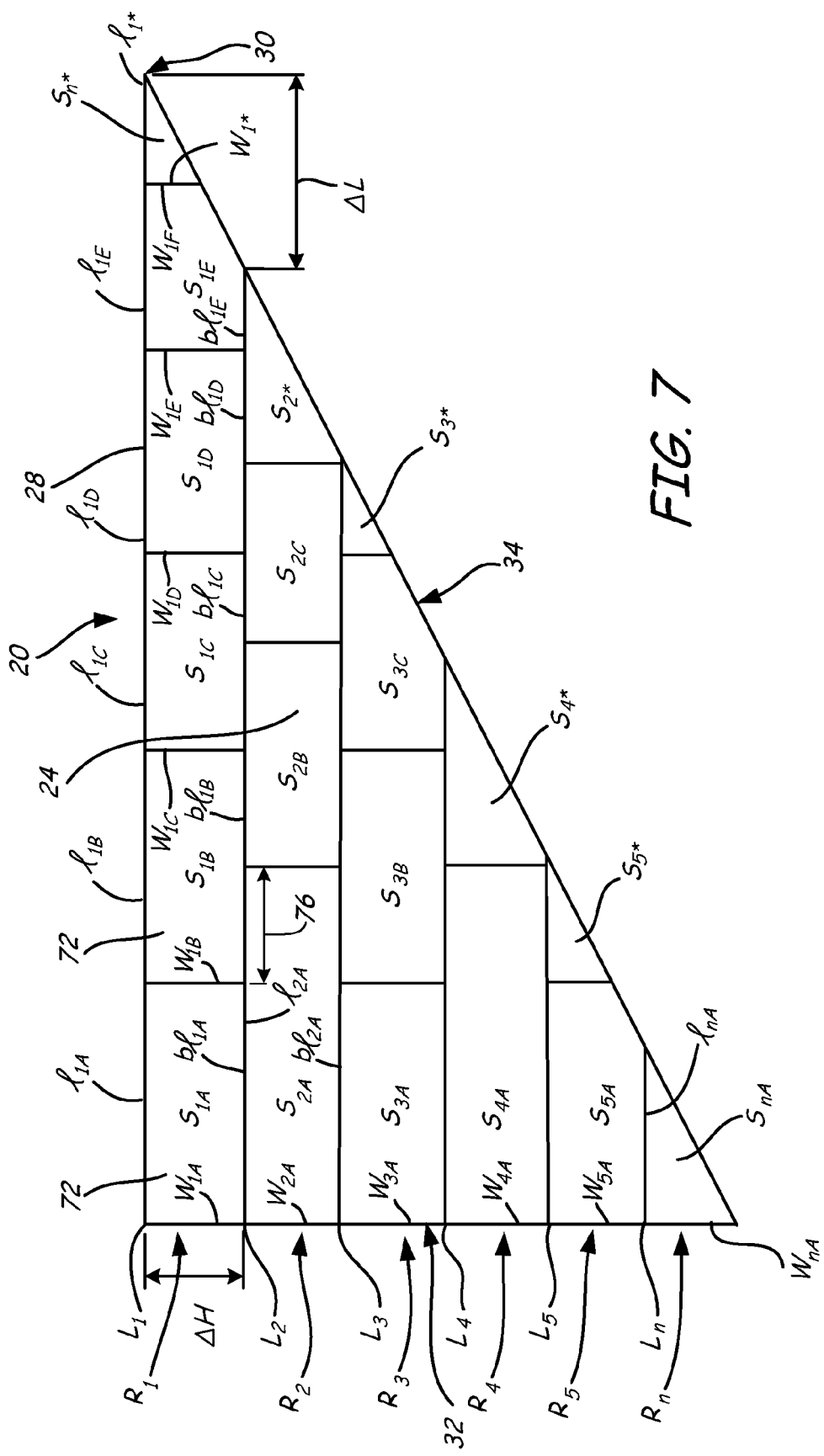
FIG. 7 shows a side view of the dormer of FIG. 1 with a coordinate system for defining the size and location of each piece of roof sheathing to be installed on the dormer roof.

FIG. 7 shows a side view of roof 24 of dormer 20, with a plurality of cut and installed roof sheathing pieces 72 supported by gable truss GT (not shown in FIG. 7) and valley trusses 34. Each roof sheathing piece $S_{n*}$ has top length $l_{n*}$, bottom length $bl_{n*}$, first width $W_{n*}$, and second width $W_{n(*+1)}$ that is identical to the first width $W_{n(*+1)}$ of an adjacent roof sheathing piece $S_{n(*+1)}$. In an exemplary embodiment, roof sheathing pieces 72, prior to any cutting, comprise rectangular sheets of plywood measuring about ninety-six inches long by about forty-eight inches wide. In other embodiments, roof sheathing pieces 72, prior to any cutting, may be any type of roof sheathing material known in the art with any starting dimension known in the art.

Each roof sheathing piece $S_{n*}$ is located in any number of horizontal rows $R_1$ through $R_n$, with row $R_1$ located along ridgeline 28 and the last row $R_n$ located along valley-line 34 at its most distant end with respect to dormer point 30. Each row $R_1$ through $R_n$ has a different respective row length $L_1$ through $L_n$. Starting with row $R_1$, each successive row differs in length by distance $\Delta L$ and is separated from the previous row by vertical rise $\Delta H$ corresponding to the vertical rise of an uncut roof sheathing piece positioned on dormer roof 24. Thus, for example, row $R_1$ has length $L_1$ and row $R_2$ has length $L_2$, with length $L_2$ being equal to $L_1 - \Delta L$. Each particular horizontal row $R_1$ through $R_n$ may include any number of roof sheathing pieces $S_{nA}$ through $S_{n*}$, with * representing the number of roof sheathing pieces (including roof sheathing piece $S_{n*}$) separating roof sheathing piece $S_{n*}$ from edge 32 using an alphabetical scale.

As shown in FIG. 7, in the dormer construction industry, it is common to horizontally offset the roof sheathing pieces $S_{n*}$ in a given row $R_n$ from roof sheathing pieces $S_{(n+/-1)*}$ in a neighboring row $R_{(n+/-1)}$ by offset distance 76. This offset pattern typically alternates every other row so that, for example, the particular roof sheathing pieces in even numbered rows are aligned horizontally with respect to each other, while the particular roof sheathing pieces in odd numbered rows are aligned horizontally with respect to each other. Examples of offset distance 76 include +24 inches, +48 inches, −24 inches, −48 inches, or any other offset distance 76 known in the art. As used herein, a positive offset distance 76 occurs when top length $l_{1A}$ is longer than top length $l_{2A}$ and a negative offset distance 76 occurs when top length $l_{1A}$ is shorter than top length $l_{2A}$.

Before installing roof sheathing 72 on roof 24, dormer installers must first construct dormer framing 40 (shown in FIGS. 2-6) to support roof sheathing 72. Constructing dormer framing 40 requires locating gable truss GT and valley trusses 42 along the pair of valley-lines 34. Even when installing pre-manufactured dormer trusses, the location of gable truss GT relative to valley truss $VT_1$ must be determined, which can be a time consuming and potentially hazardous process. In addition, the dormer installers may also need to determine cut details for lookout 52, nailer 58, and fascia F. After dormer framing 40 has been constructed on main roof 22, the dormer installers must then install roof sheathing 72 on dormer framing 40. When using conventional methods, this typically involves custom cutting each roof sheathing piece $S_{n*}$ while on main roof 22. These conventional methods can result in significant material waste, prolonged exposure time on the roof, and a hazardous conditions resulting from material waste dropped from main roof 22. The dormer calculator of the present invention provides an efficient method for laying out dormer framing 40 and roof sheathing 72 while on the ground, thereby saving time, reducing material waste, and reducing the hazards associated with conventional methods.

Figure 8:
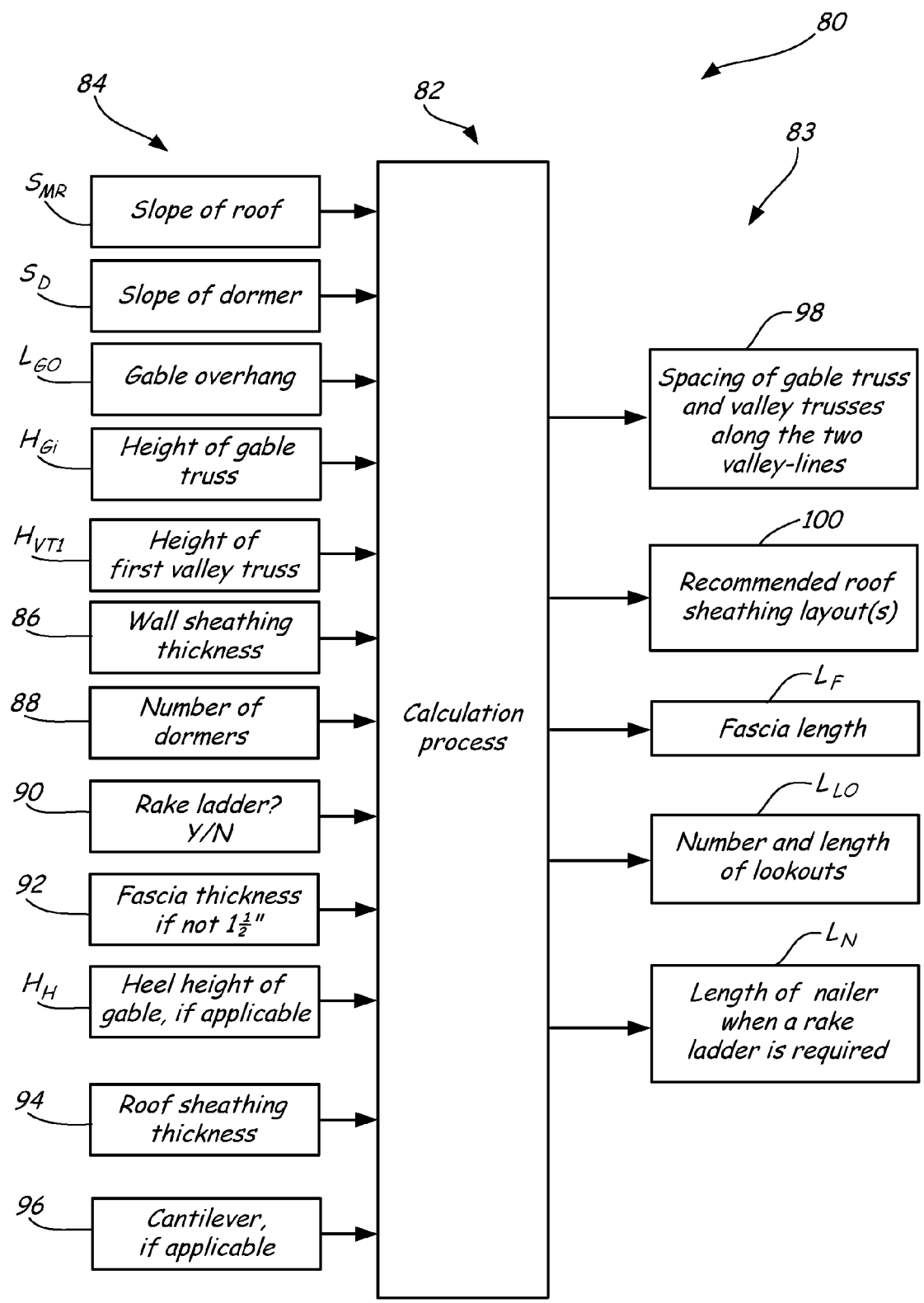
FIG. 8 is a block diagram representation of a method of the present invention for producing a plurality of dormer outputs as a function of a plurality of dormer inputs.

FIG. 8 is a block diagram illustrating of an exemplary embodiment of dormer calculator 80 of the present invention. Dormer calculator 80 uses calculation process 82 to generate dormer outputs 83 as a function of one or more dormer inputs 84. Examples of dormer inputs 84 include main roof slope $S_{MR}$, dormer slope slope $S_D$, gable overhang length $L_{GO}$, gable truss height $H_{Gi}$, valley truss height $H_{VT1}$, wall sheathing thickness input 86, input 88 representing the total number of dormers to be constructed, input 90 representing whether a rake ladder detail will be included in dormer 20, input 92 representing the fascia thickness, heel height $H_H$, input 94 representing the roof sheathing thickness of main roof 22, input 96 indicating whether a cantilevered fascia is to be included in dormer 20, and/or any other dormer input known in the art. Any number and combination of dormer inputs 84 may be inputted into calculation process 82 to yield one or more dormer outputs 83. For example, in one embodiment of dormer calculator 80, slope $S_{MR}$, slope $S_D$, length $L_{GO}$, height $H_{Gi}$, and height $H_{VT1}$ are mandatory inputs, while the remaining inputs 84 shown in FIG. 8 are optional inputs.

Examples of dormer outputs 83 include output 98 indicating locations of gable truss GT and one or more valley rafter 42 along valley-lines 34, output 100 indicating a recommended roof sheathing offset distance(s) 76 and roof sheathing cut dimensions, fascia length $L_F$, a number of lookouts 52 and length $L_{LO}$ for lookouts 52, nailer length $L_N$ when a rake ladder detail is required, and/or any other dormer output known in the art. Depending upon the particular embodiment of dormer calculator 80, dormer outputs 83 may be generated by calculation process 82 in any number or combination. For example, in one embodiment of dormer calculator 80, a single dormer output 81 is produced by calculation process 82 as a function of one or more dormer inputs 84, while, in the embodiment of FIG. 8, a plurality of dormer outputs 83 are generated as a function of a plurality of dormer inputs 84.

Dormer calculator 80 may be used with any measurement system (such as, for example, metric or imperial) and any sizes of roof sheathing pieces and framing materials known in the art. In some embodiments, the uncut dimensions of the roof sheathing pieces and/or the framing materials are inputted into dormer calculator 80 by a user. In one embodiment, one or more dormer truss spacing preferences (such as, for example, the spacing along ridgeline 28 between inside faces of adjacent valley trusses) are inputted into dormer calculator 80 by a user.

Figure 9:
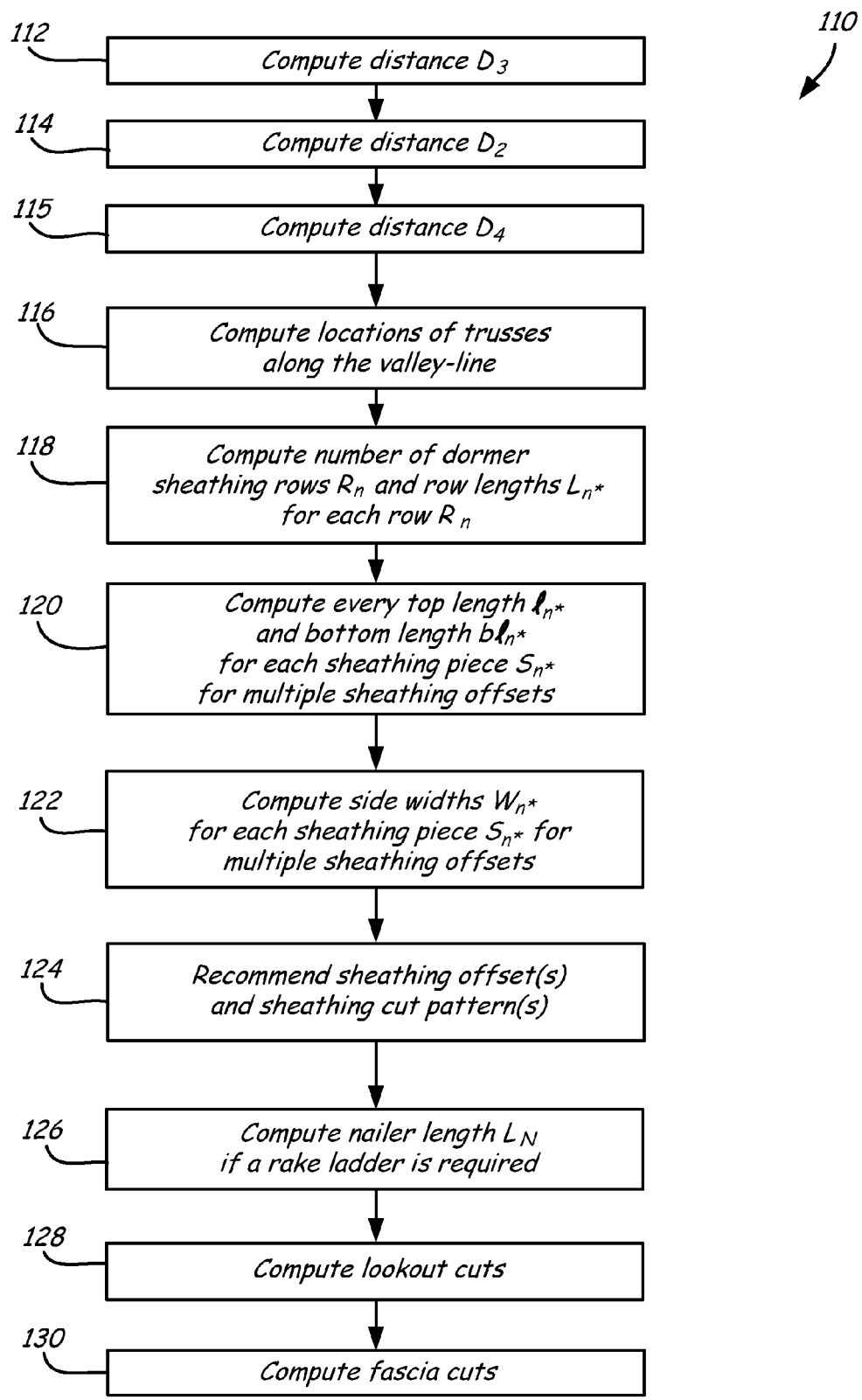
FIG. 9 is a flow diagram illustrating a calculation process for use in the method of FIG. 8.
Figure 10A:
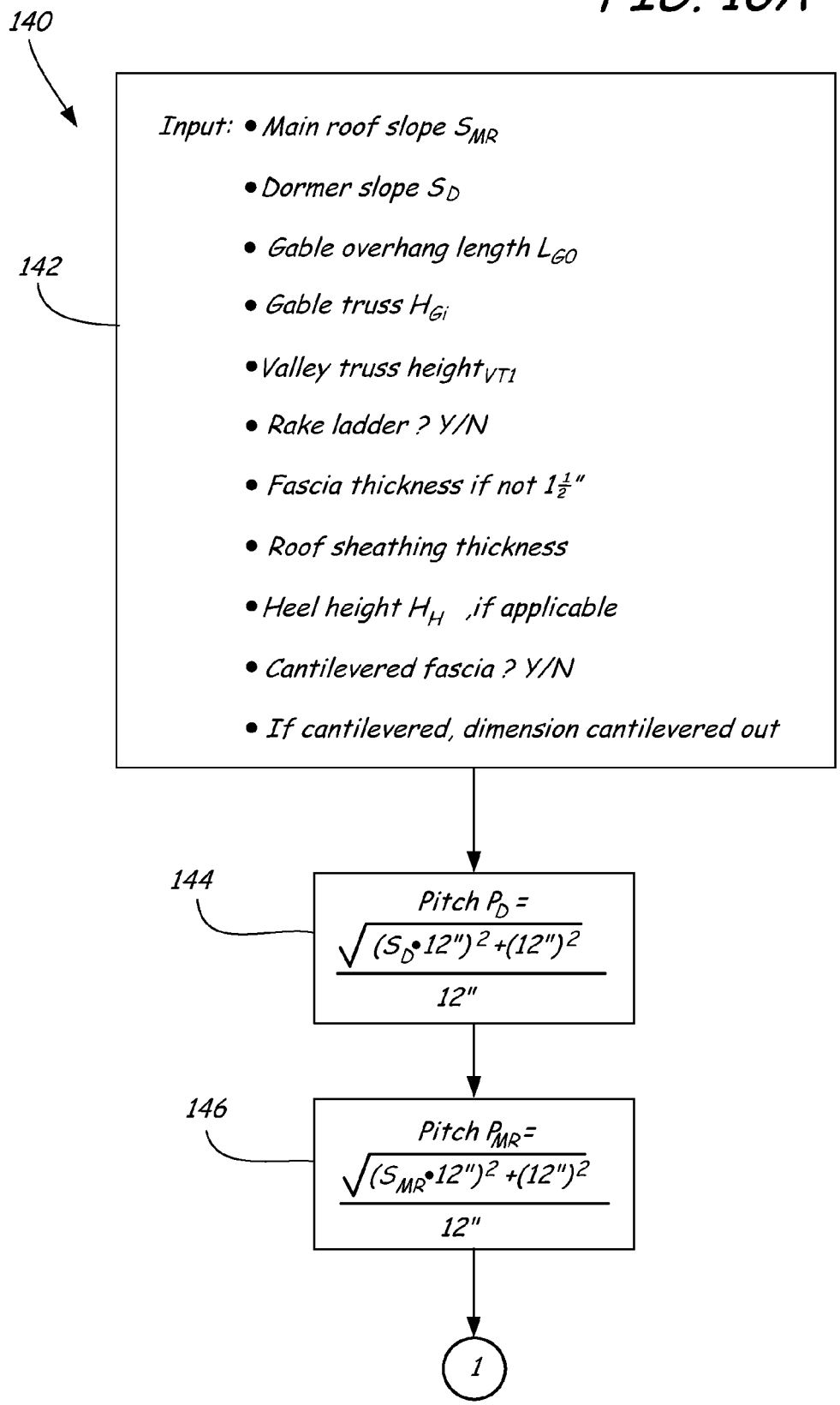
FIGS. 10A-10K are flow diagrams illustrating an embodiment of the calculation process of FIG. 9.
Figure 10B:
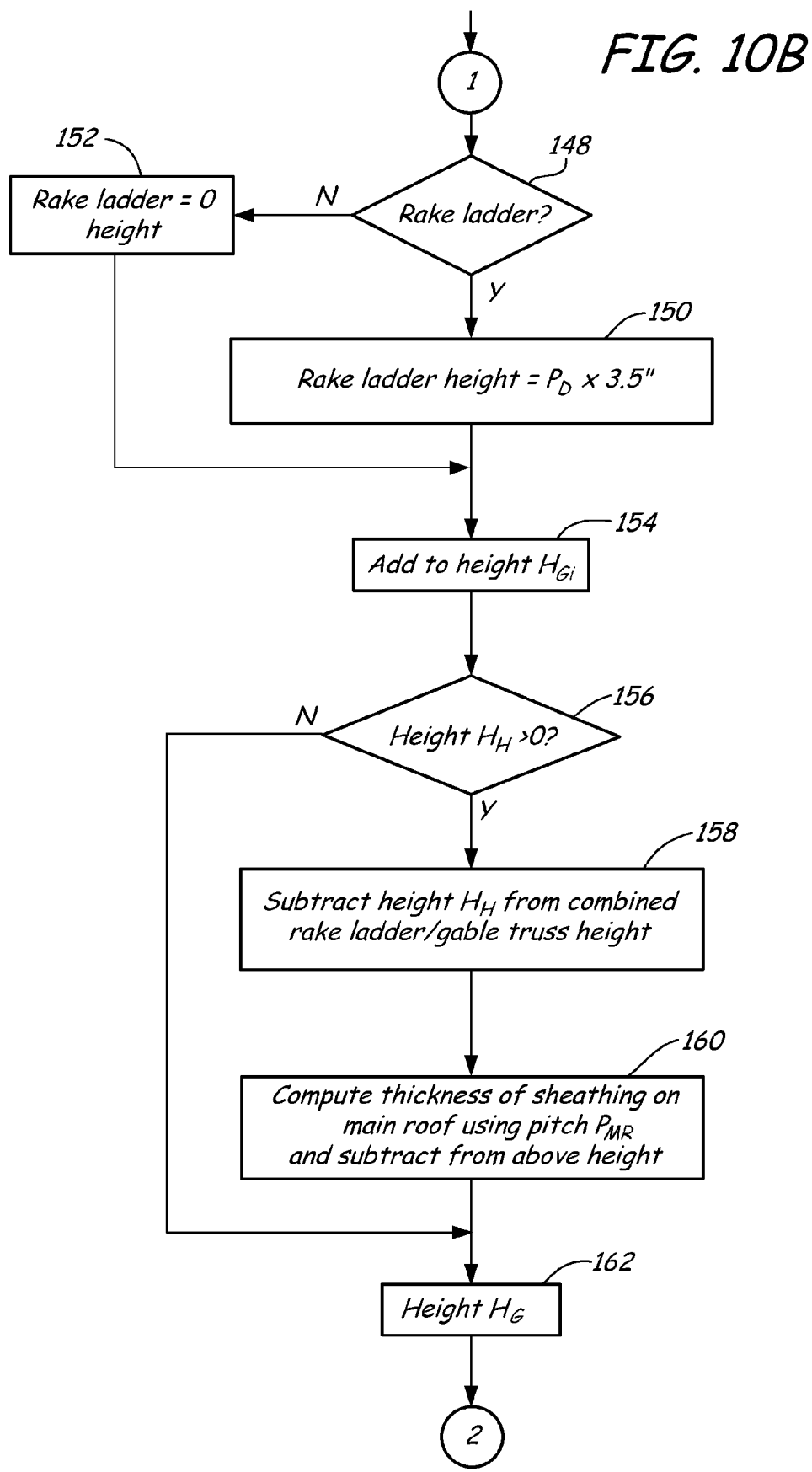
Figure 10C:
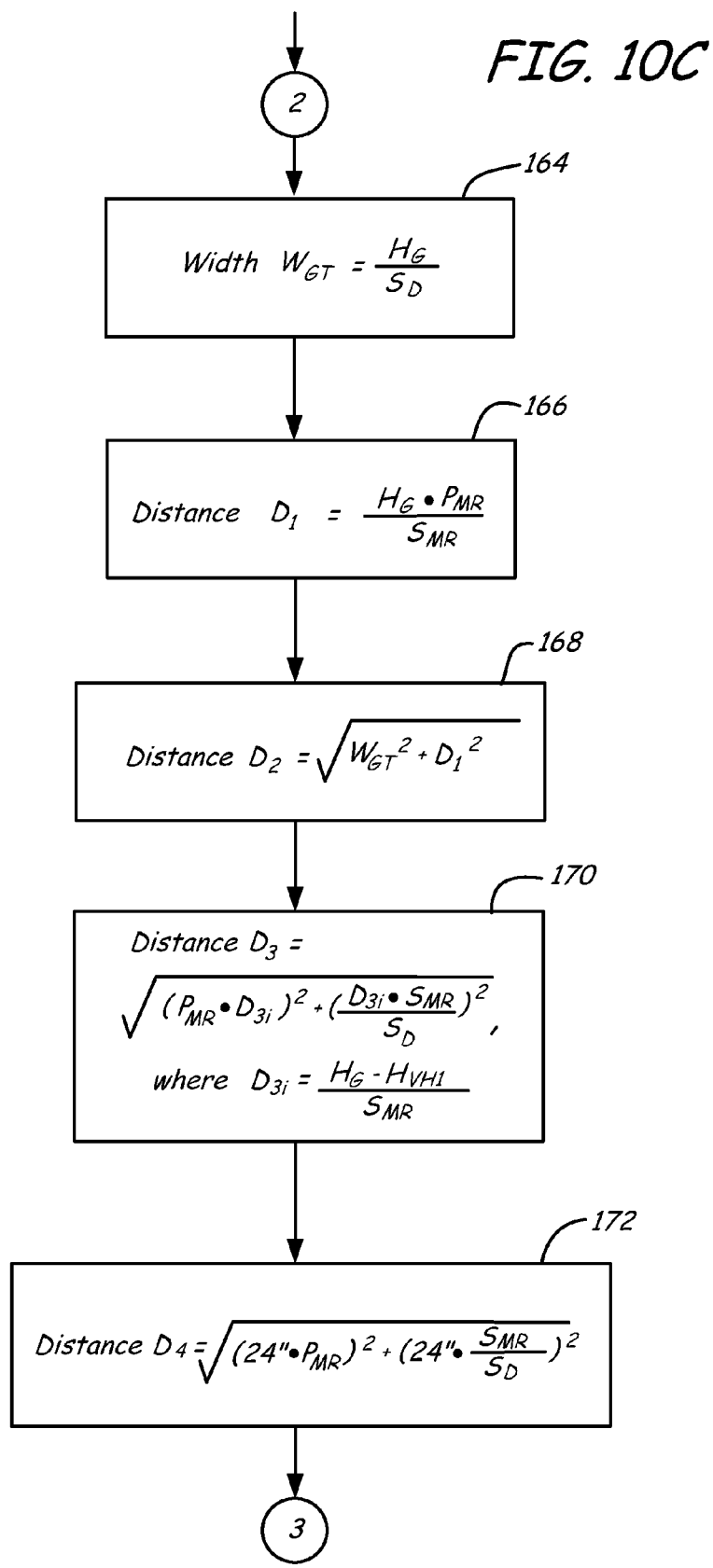
Figure 10D:
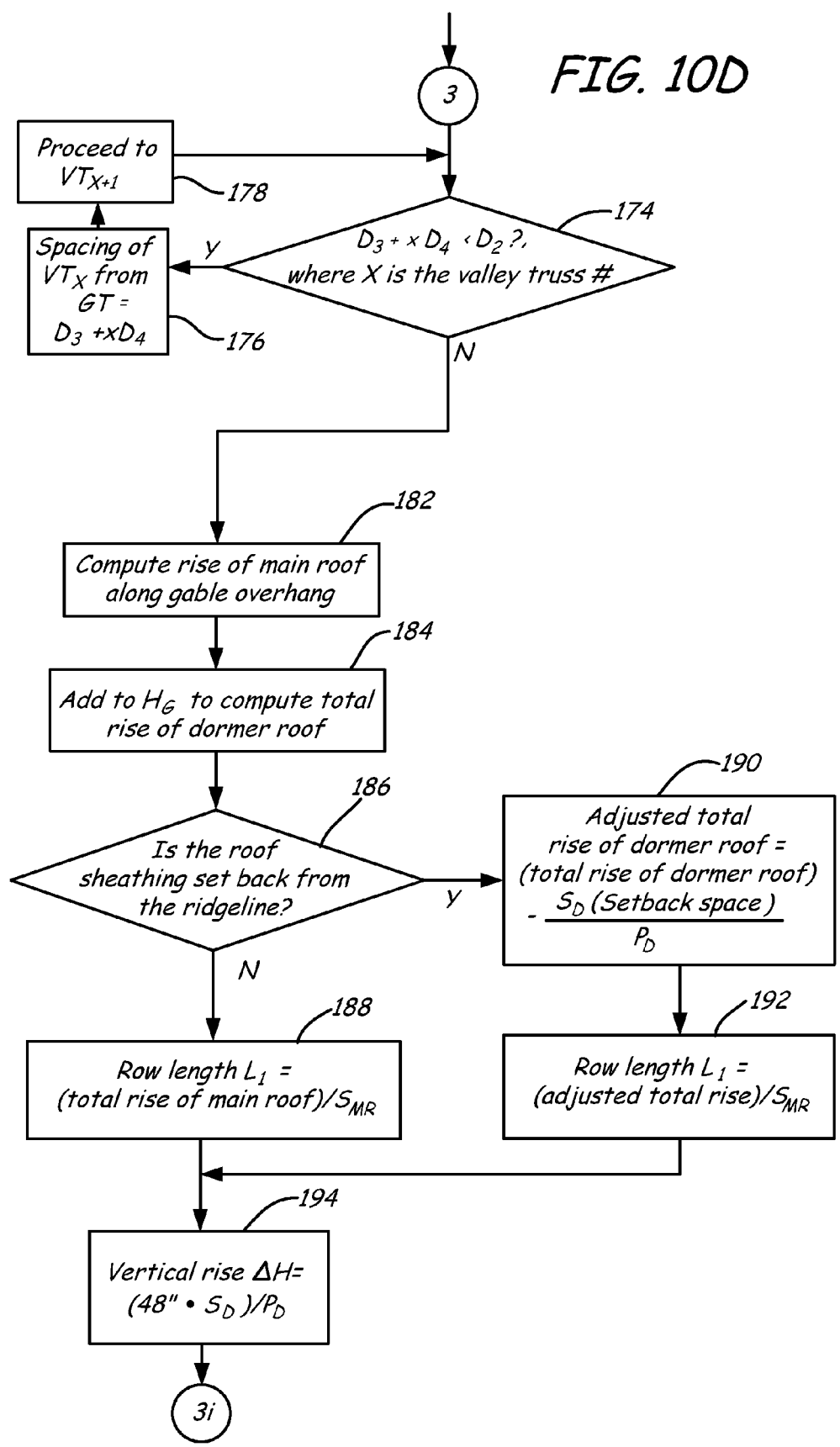
Figure 10E:
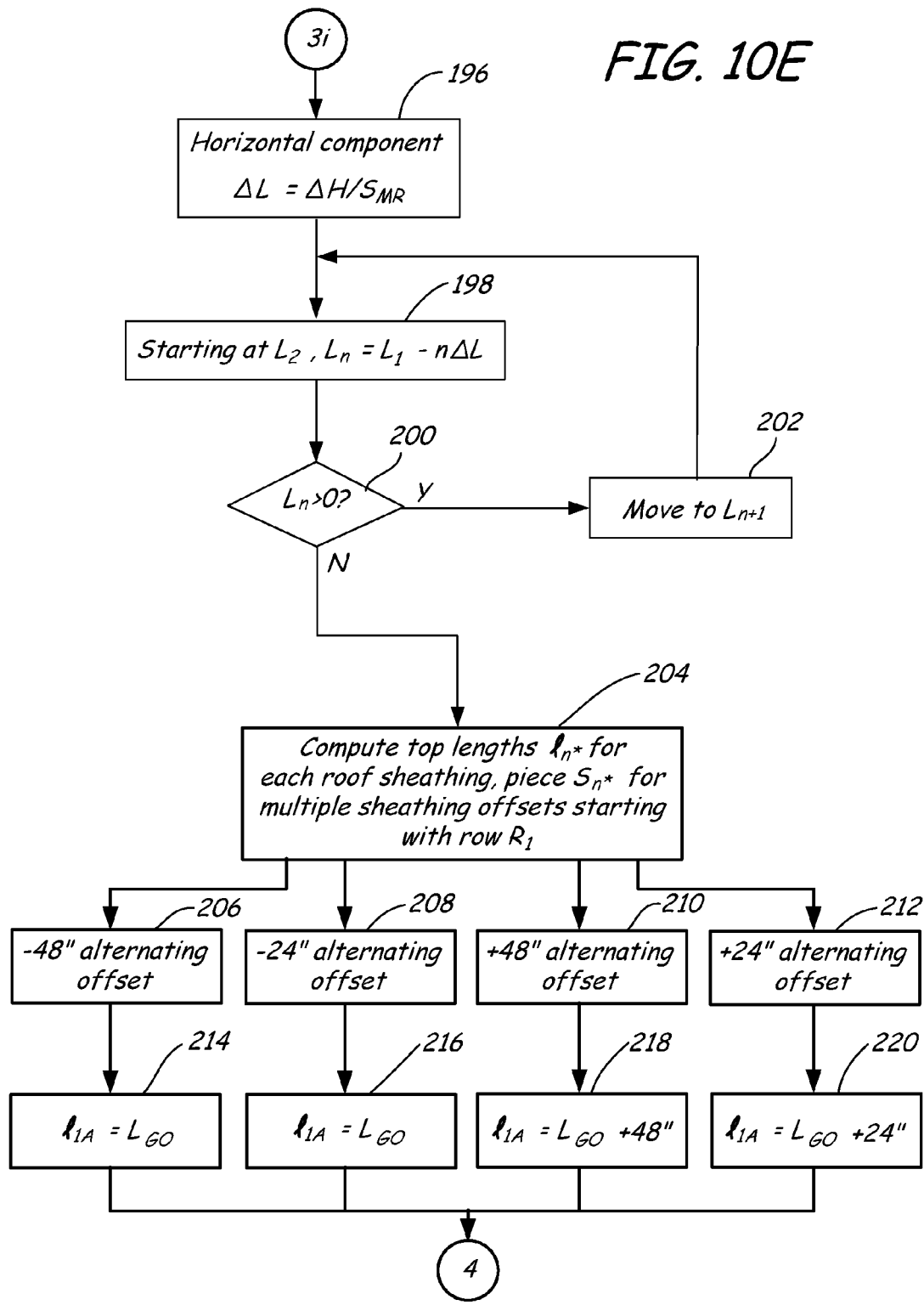
Figure 10F:
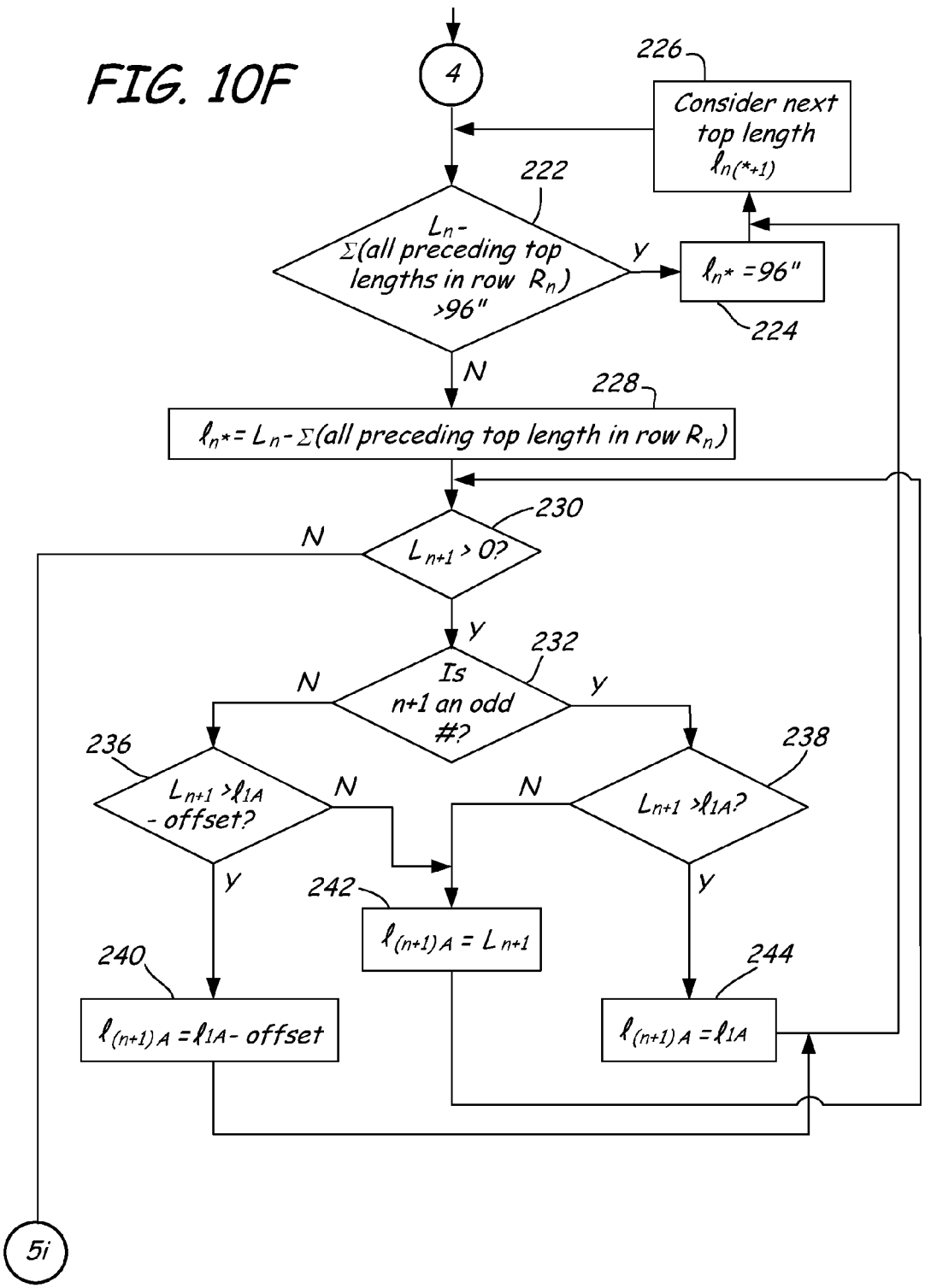
Figure 10G:
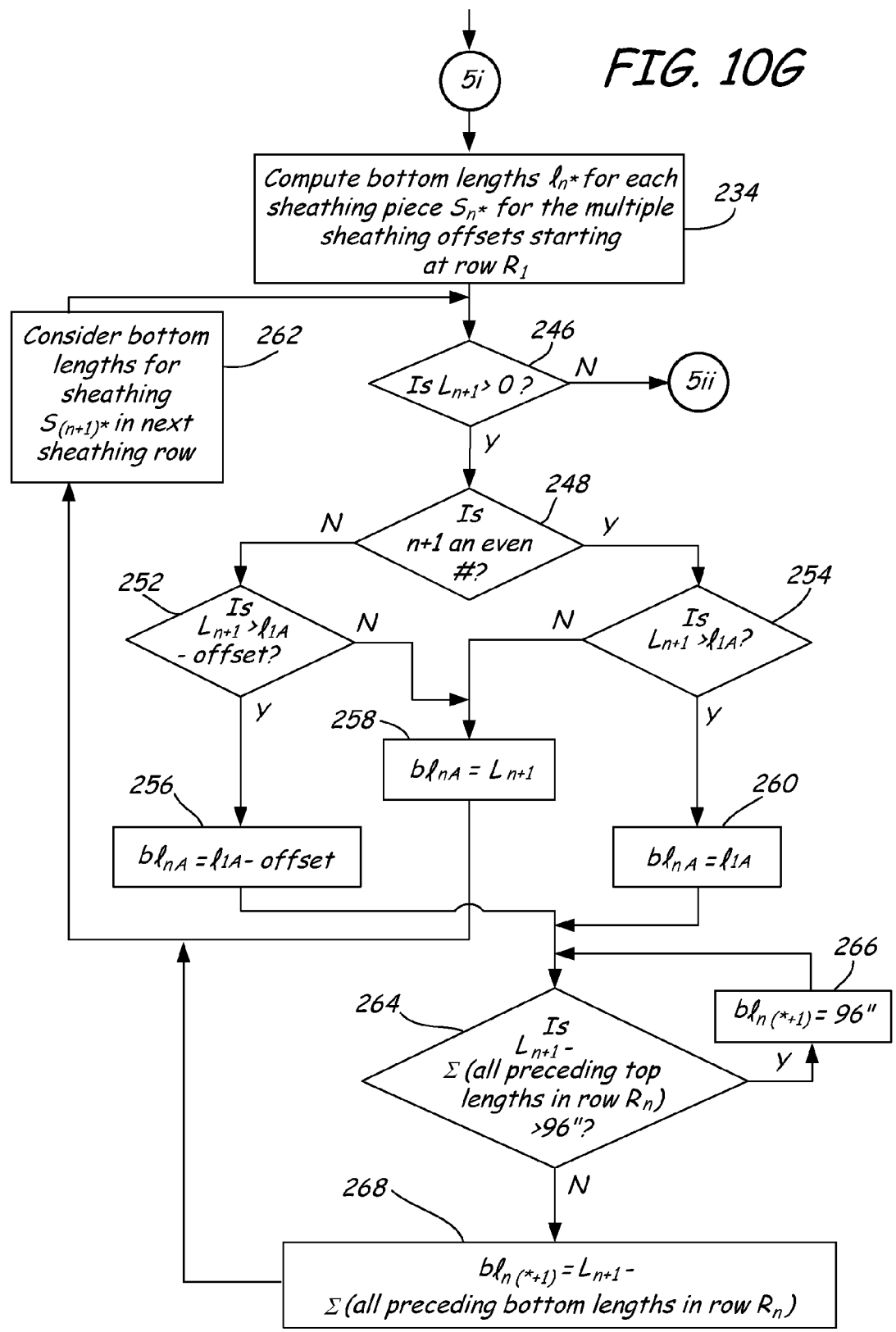
Figure 10H:
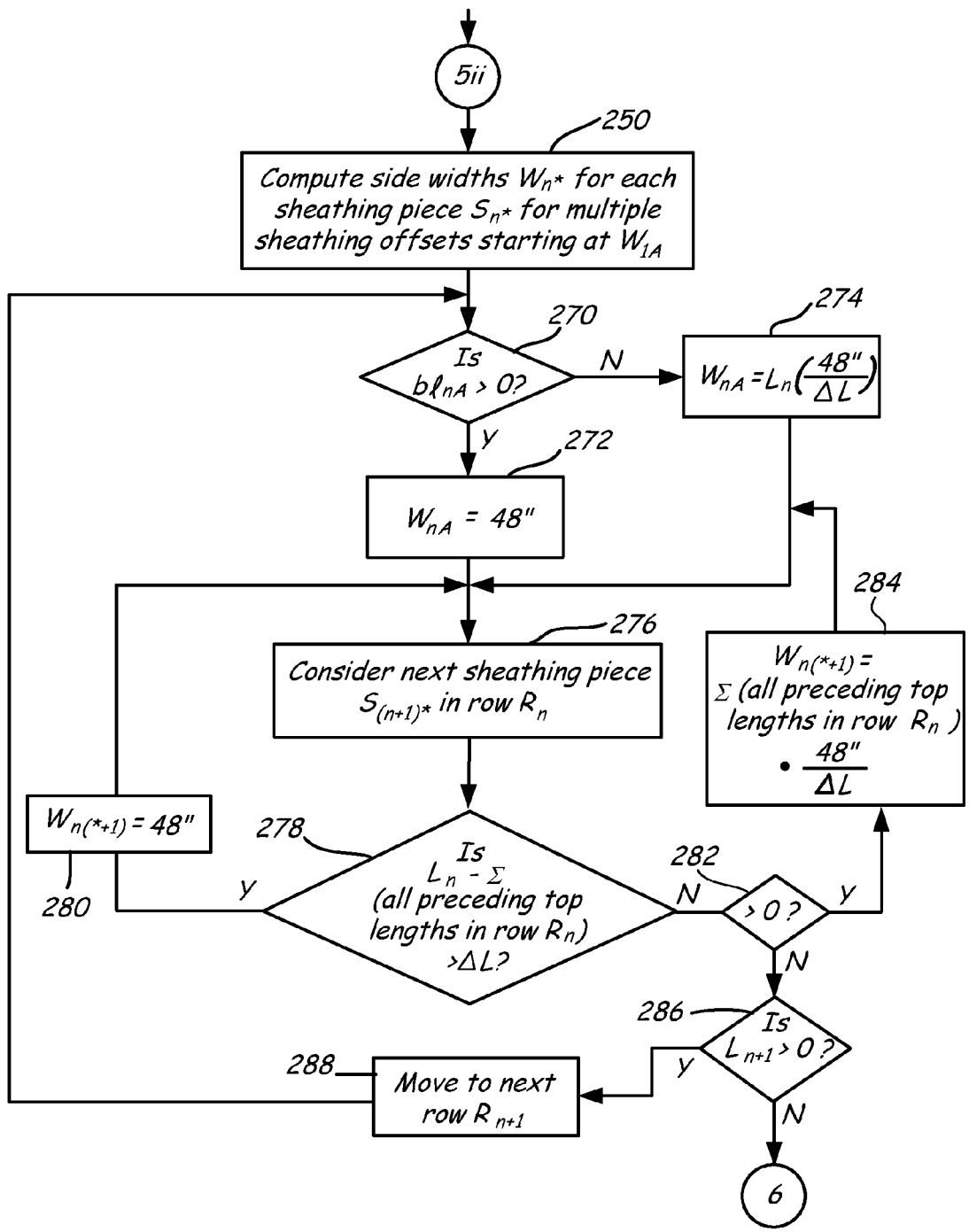
Figure 10I:
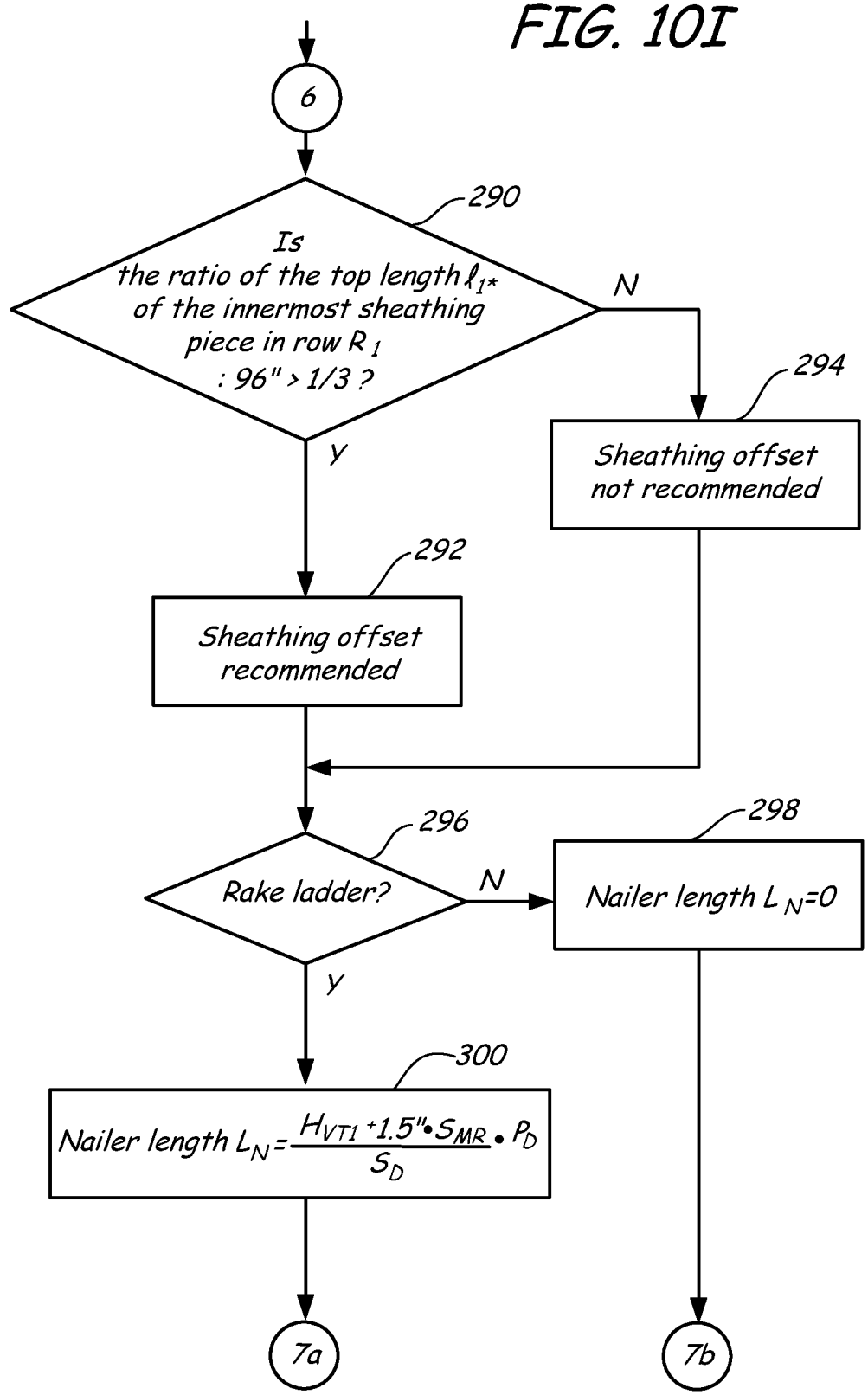
Figure 10J:
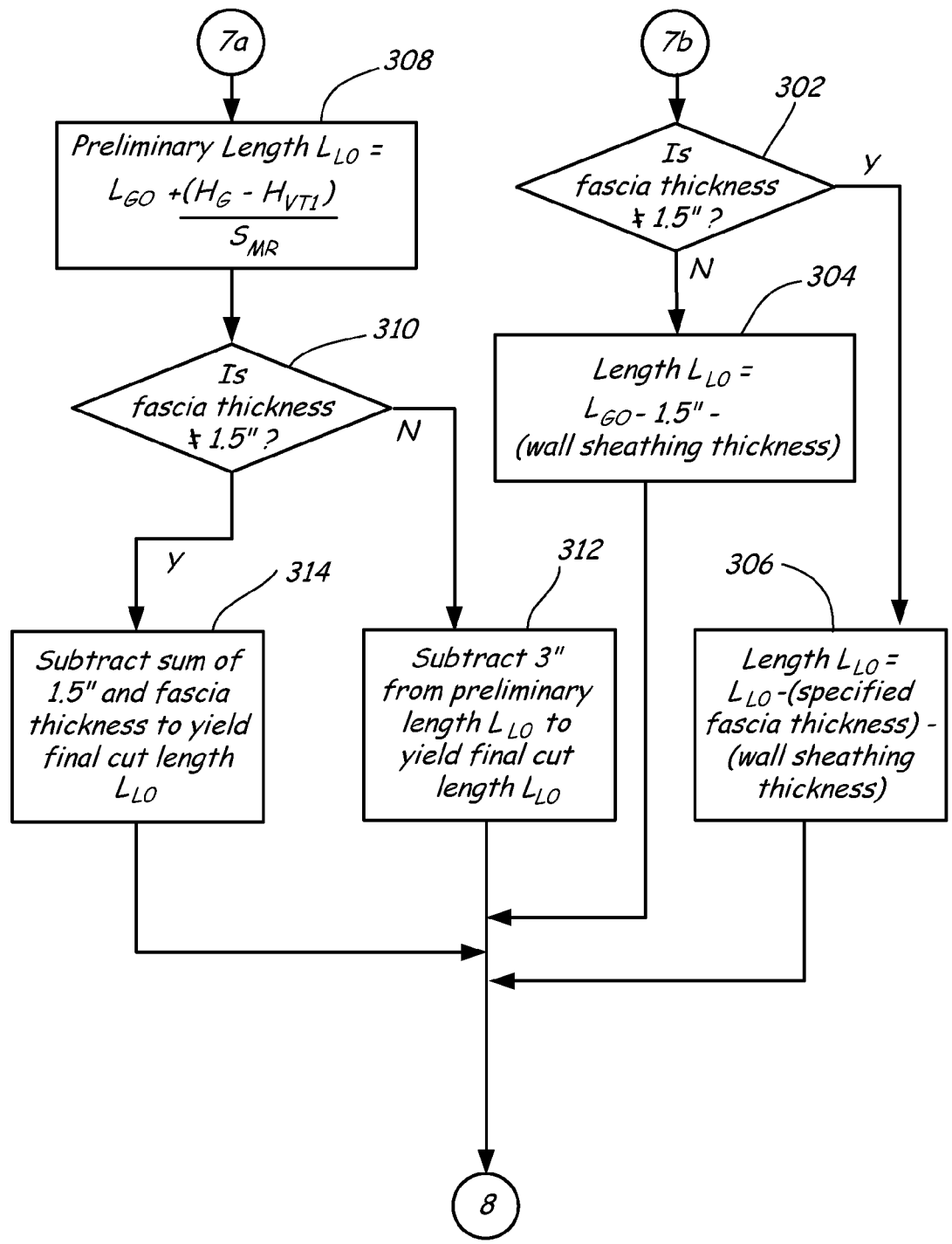
Figure 10K:
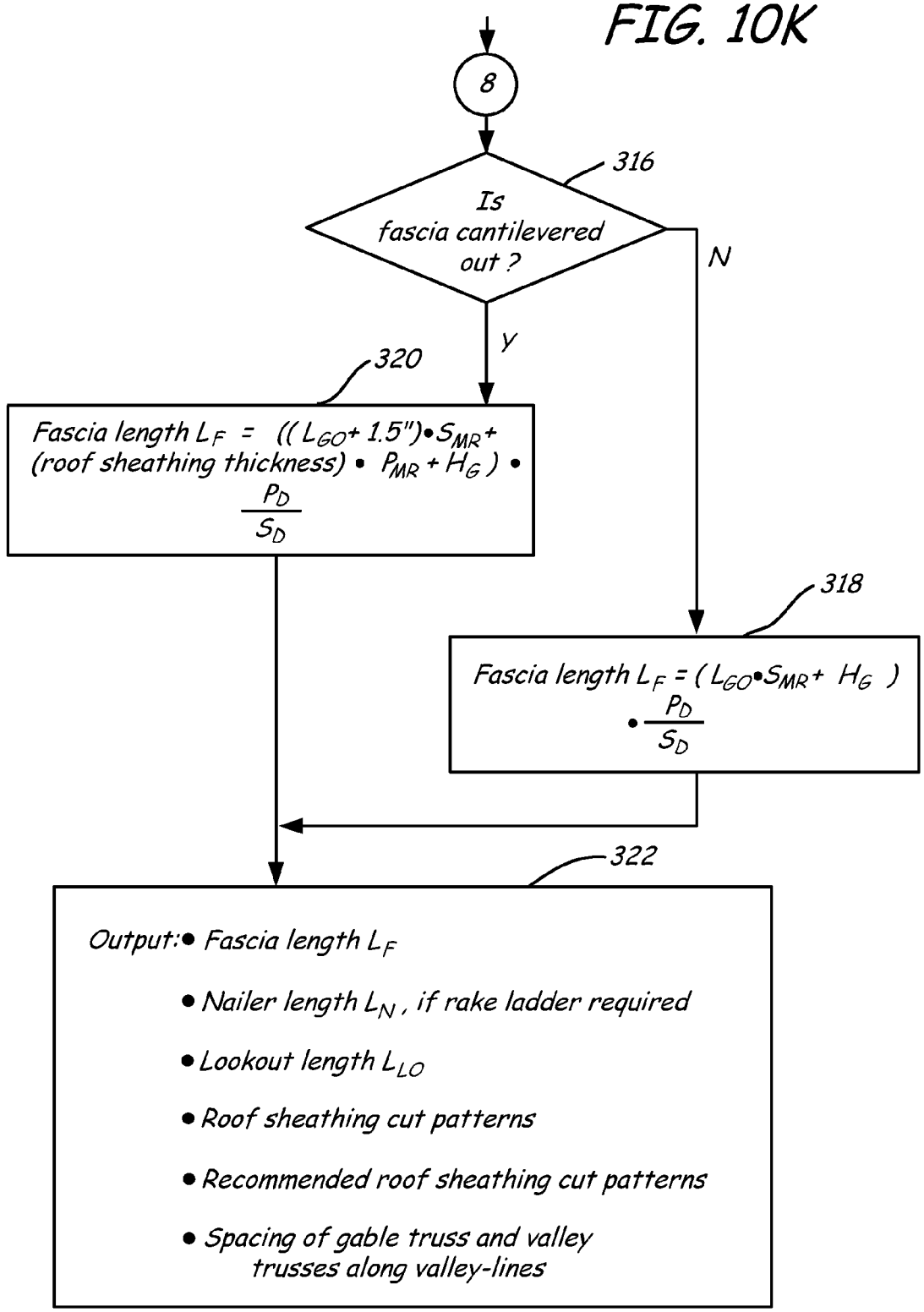

The following is a summary of the abbreviations used in FIGS. 9 and 10:
$bl_{n*}$ Bottom length for a piece of dormer roof sheathing $S_{n*}$.
CL Centerline running along the main roof between the pair of valley-lines and equidistant to each valley-line.
$D_1$ Distance gable truss GT is spaced from the dormer point along CL.
$D_2$ Distance gable truss GT is spaced from the dormer point along the valley-lines.
$D_{3i}$ Distance gable truss GT is spaced from valley truss $VT_1$ along the ridgeline.
$D_3$ Distance gable truss GT is spaced from valley truss $VT_1$ along the valley-lines.
$D_4$ Uniform distance the valley trusses are spaced from each other along the valley-lines.
GT Gable truss.
$\Delta H$ Vertical rise of an uncut roof sheathing piece $S_{n*}$ positioned on the dormer roof.
$H_{Gi}$ Height of gable truss GT.
$H_G$ Full inside height of gable truss GT, as measured from the dormer roof directly above gable truss GT.
$H_{VTX}$ Height of valley truss $VT_x$.
$H_H$ Heel height for gable truss GT.
$l_{n*}$ Top length of roof sheathing piece $S_{n*}$.
$L_{GO}$ Length of the gable overhang.
$L_{LO}$ Length of the lookout.
$L_n$ Length of horizontal roof sheathing row $R_n$.
$L_N$ Length of a nailer for attaching a lookout to $VT_1$.
$P_D$ Pitch of the dormer roof.
$P_{MR}$ Pitch of the main roof.
$R_n$ Horizontal row of roof sheathing on a dormer roof.
$S_{n*}$ Piece of roof sheathing in row $R_n$ at horizontal location *.
$VT_x$ Number x valley truss.
$W_{GT}$ Width of gable truss GT measured from centerline CL.
$W_{n*}$ Outside width of a piece of roof sheathing $S_n*$.

FIG. 9 is a flow diagram illustrating a calculation process 110, which is an embodiment of calculation process 82 of FIG. 8. In steps 112 through 116, process 100 generates information related to the positioning of gable truss GT and valley rafters 42 in dormer 20. At steps 112, 114, and 115, process 110 computes distances $D_3$, $D_2$, and $D_4$, respectively (see FIGS. 2A and 2B). Using distances $D_2$, $D_3$, and $D_4$, process 112 computes the locations of gable truss GT and valley rafters 42 along valley-line 34 at step 116.

As shown in steps 118 through 124 of FIG. 9, process 110 generates information related to the positioning of roof sheathing 72 on dormer roof 24. At step 118 of FIG. 9, process 110 computes row length $L_n$ (FIG. 7) for each roof sheathing row $R_n$. Using the information generated in step 118 process 100 then computes top length $l_{n*}$ and bottom length $bl_{n*}$. (FIG. 7) at step 120 for every roof sheathing piece $S_{n*}$ for multiple roof sheathing offsets 76. At step 122, process 110 then generates width $W_{n*}$ (FIG. 7) for each roof sheathing piece $S_{n*}$. At step 124, process 110 then recommends one or more sheathing offsets 76 from the multiple sheathing offsets 76 of step 120.

In steps 126 through 130 of FIG. 9, process 110 generates information related to the attachment of fascia F to gable truss GT. If a rake ladder detail is required as shown in FIG. 3, process 110 generates nailer length $L_N$ at step 126. At step 128, process 110 generates length $L_{LO}$ and a number of lookouts 52 to be cut (see FIGS. 3 and 4). At step 130, process 110 generates length $L_F$.

Thus, when a user inputs the relevant dormer inputs 84 of FIG. 8 into calculation process 110 of FIG. 9, calculation process 110 computes, and outputs to the user, the dormer framing layout information needed to construct dormer framing 40 of FIGS. 2 through 6 on main roof 22. Using dormer inputs 84 and the dormer framing layout information, calculation process 110 also computes, and outputs to the user, one or more recommended roof sheathing layouts.

FIG. 10 (including FIGS. 10A-10K) is a flow diagram illustrating calculation process 140, which is a detailed embodiment of calculation process 110 of FIG. 9, for generating dormer outputs 83 as a function of dormer inputs 84. As shown in FIG. 10, a plurality of dormer inputs 84 are inputted into process 140 at step 142. Process 140 then executes a plurality of steps 144 through steps 320 and outputs a plurality of dormer outputs 83 to a user at step 322.

Steps 144 through 178 of FIG. 10 are detailed descriptions of the processes involved in performing steps 112 through 116 of FIG. 9 and yield the locations of gable truss GT and valley trusses 42 along valley-lines 34 (FIGS. 2A and 2B). Steps 182 through 202 of FIG. 10 are detailed descriptions of the processes involved in performing step 118 of FIG. 9 and yield row length $L_n$ for each row $R_n$ (FIG. 7). Steps 204 through 268 of FIG. 10 correspond to step 120 of FIG. 9 and yield top length $l_{n*}$ and bottom length $bl_{n*}$ for each roof sheathing piece $S_{n*}$ (FIG. 7). Steps 270 through 288 of FIG. 10 are detailed descriptions of the processes involved in performing step 122 of FIG. 9 and yield width $W_n$ (FIG. 7) for each roof sheathing piece $S_{n*}$. Steps 290 through 294 of FIG. 10 are detailed descriptions of the processes involved in performing step 124 of FIG. 9 and yield one or more recommended sheathing offsets 76 (FIG. 7). Steps 296 through 300 of FIG. 10 are detailed descriptions of the processes involved in performing step 126 and yield nailer length $L_N$. Steps 302 through 314 of FIG. 10 are detailed descriptions of the processes involved in performing step 128 of FIG. 9 and yield length $L_{LO}$ (see FIGS. 3 and 4). Steps 316 through 320 of FIG. 10 are detailed descriptions of the processes involved in performing step 130 of FIG. 9 and yield length $L_F$.

As discussed above, steps 144 through 178 of process 140 yield the locations of gable truss GT and valley trusses 42 along valley-lines 34. In step 144, the pitch $P_D$ of dormer roof 24 is computed using the formula $P_D = ((S_D \cdot 12")^2 + (12")^2)^{1/2}/12"$. Thus, in this embodiment, $P_D$ represents the ratio of a length along dormer roof 24 (i.e., a hypotenuse length) to a horizontal component of that length. Step 146 calculates the main roof pitch, $P_{MR}$, using the above equation for step 144 with slope $S_{MR}$ substituted in place of slope $S_D$. Steps 144 and 146 are optional and are included to simplify downstream calculations. As determined by decision step 148, if a rake ladder detail is required, a rake ladder height is determined in step 150 by multiplying pitch $P_D$ by 3.5 inches. The 3.5 inch multiplier term in step 150 represents the vertical width of lookout 52 (see FIGS. 3 and 4) assuming lookout 52 is cut from two-by-four stock material. In other embodiments, this multiplier is supplied by the user and inputted into process 140 at step 142. In still other embodiments, a different multiplier than 3.5 inches is supplied by process 140 pursuant to the dimensions of lookout 52. If a rake ladder detail is not required, a rake ladder height is set at zero pursuant to step 152. As indicated by step 154, the rake ladder height resulting from step 150 or step 152 is then summed with height $H_{gi}$ (shown in FIG. 2A).

Decision step 156 determines whether gable truss GT has a heel height $H_H$ greater than zero, as shown in FIG. 6. If gable truss GT does not have a heel height (i.e., $H_H \leq 0$), the combined rake ladder/gable truss GT height determined in step 154 is the full inside height of the gable, $H_G$, as indicated by step 162. However, if gable truss GT has a non-zero heel height $H_H$, heel height $H_H$ is subtracted from the combined rake ladder/gable truss GT height by step 158 to yield an adjusted gable height. At step 160, the vertical thickness of the roof sheathing on main roof 22 is then determined by multiplying the inputted roof sheathing thickness by pitch $P_{MR}$ and summing the product with the adjusted gable height of step 158 to yield height $H_G$, as indicated in step 162.

At step 164, $W_{GT}$ of FIG. 2B is computed by dividing height $H_G$ by slope $S_D$. Distance $D_1$ of FIGS. 2A and 2B is computed at step 166 using the equation distance $D_1 = H_G P_{MR}/S_{MR}$. Distance $D_2$ of FIGS. 2A and 2B is then computed at step 168 using the equation distance $D_2 = (W_{GT}^2 + D_1^2)^{1/2}$. Distance $D_3$ of FIGS. 2A and 2B is computed by first calculating distance $D_{3i}$ in step 170 using the equation distance $D_{3i} = (H_G - H_{VH1})/S_{MR}$. Distance $D_3$ is then computed in step 170 using the equation distance $D_3 = ((P_{MR} D_{3i})^2 + (D_{3i} S_{MR}/S_D)^2)^{1/2}$. At step 172, distance $D_4$ of FIGS. 2A and 2B is computed using the equation distance $D_4 = ((24" \cdot P_{MR})^2 + (24" \cdot S_{MR}/S_D)^2)^{1/2}$, where 24 inches is the spacing along ridgeline 28 between inside faces of adjacent valley trusses $VT_X$ and $VT_{X+1}$. In the embodiment of FIG. 10, valley trusses 42 are spaced pursuant to the industry standard of twenty-four inches on center along ridgeline 28. In other embodiments, valley trusses 42 may be spaced pursuant to any spacing used in the art. In step 176, the spacing of each particular valley truss $VT_x$ from gable truss GT is determined by summing $D_3$ and the product $xD_4$, where x is the valley truss number. As indicated by steps 178 and 174, this process is continued for each successive valley truss, $VT_{x+1}$, as long as the sum of $D_3 + xD_4$ is less than $D_2$. Once the sum of $D_3 + xD_4$ is less than or equal to $D_2$ the above iterative process ceases as indicated by decision step 174.

As discussed above, steps 182 through 202 yield row length $L_n$ for each row $R_n$ of FIG. 7. Starting at step 182, the vertical rise of main roof 22 along the gable overhang is computed. This vertical rise is then summed with height $H_G$ to yield the total vertical rise of dormer roof 24 from outer edge 32 of dormer roof 24 to dormer point 30. In steps 186 though 192, row length $L_1$ is calculated. If row $R_1$ is set back from ridgeline 28 so that a space (not shown in FIG. 7) along dormer roof 24 separates row $R_1$ from ridgeline 28, the vertical component of the setback space is subtracted from the total vertical rise of dormer roof 24 computed in step 186. The vertical component of the setback space is computed in step 190 by multiplying the setback space by slope $S_D$ and then dividing the product by pitch $P_D$. As indicated in steps 188 and 192, depending on whether dormer 20 has a setback space, row length $L_1$ is computed by dividing the total vertical rise of dormer roof 24 (minus any vertical setback) by slope $S_{MR}$.

The vertical rise $\Delta H$ (shown in FIG. 7) of a full piece of roof sheathing located on dormer roof 24 is computed in step 194 using the calculation $\Delta H = (48") S_D/P_D$, where 48 inches represents the uncut width of rectangular roof sheathing having a length of 96 inches. In other embodiments, this uncut width in step 194 is greater than or less than 48 inches, depending upon the size of the roof sheathing material employed. In step 196, the distance $\Delta L$ of FIG. 7 is computed by dividing vertical rise $\Delta H$ by slope $S_{MR}$. Then, as indicating by step 198, row length $L_n$ for each dormer sheathing row $R_n$ is computed using the calculation $L_n = L_1 - n\Delta L$, where n is the sheathing row number of row $R_N$. As indicated by decision step 200, this calculation is repeated for each successive row, $R_{n+1}$, until row length $L_n$ is no longer greater than zero, at which point process 140 moves on to step 204.

As previously mentioned, steps 204 through 268 yield top length and bottom length $bl_{n*}$ for each roof sheathing piece $S_{n*}$ of FIG. 7. As shown in the embodiment of FIG. 10 in steps 204 through 220, starting with row $R_1$, top length $l_{1A}$ is computed for a $-48$ inch offset, a $-24$ inch offset, a $+48$ inch offset, and a $+24$ inch offset. In other embodiments of process 140, top length $l_{1A}$ may be computed for any sheathing offset 76 of FIG. 7 known in the art in any combination, with steps 214 through 220 being modified accordingly. Top length and bottom length $bl_{n*}$ are then calculated for each roof sheathing piece $S_{1*}$ in row $R_1$. Moving inward from roof sheathing piece $S_{1A}$ relative to edge 32 of FIG. 7, as indicated by steps 222 and 226, if the difference between row length $L_1$ and the sum of all top lengths proceeding roof sheathing piece $S_{1*}$ is greater than 96 inches, top length $l_{n*}$ is set to equal 96 inches by step 224. Process 140 then considers top length $l_{n(*+1)}$ for the next roof sheathing piece $S_{n(*+1)}$ and repeats decision step 222 for each successive roof sheathing piece $S_{1(*+1)}$ until the difference between row length $L_1$ and the sum of all preceding top lengths $l_{1*}$ in row $R_1$ is no longer greater than 96 inches. Once this occurs, top length $l_{1*}$ for that particular roof sheathing piece $S_{n*}$ is computed by step 228 as the difference between row length $L_n$ and the sum of all preceding top lengths $l_{1*}$ in row $R_1$.

As indicated by decision step 230, process 140 then moves to the next row $R_{n+1}$ and determines whether row length $L_{n+1}$ is greater than zero. If row length $L_{n+1}$ is not greater than zero, process 140 moves to step 234 and begins computing every bottom length $bl_{n*}$. However, if row length $L_{n+1}$ is greater than zero, decision step 232 determines whether the row number, n+1, for row $R_{n+1}$ is an odd number. If n+1 is an odd number, decision step 238 determines whether row length $L_{n+1}$ is greater than top length $l_{1A}$. If row length $L_{n+1}$ is not greater than top length $l_{1A}$, then top length $l_{(n+1)A}$ is set to equal row length $L_{n+1}$ by step 242, and process 140 returns to step 230 and moves to the next roof sheathing row. If, however, row length $L_{n+1}$ is greater than top length $l_{1A}$, then top length $l_{(n+1)A}$ is set to equal top length $l_{1A}$ as indicated in step 234, and process 240 returns to step 226 to consider the next top length $l_{n*}$ in the same roof sheathing row. Returning to decision step 232, if n+1 is not an odd number, decision step 236 determines whether row length $L_{n+1}$ is greater than the difference in length between top length $l_{1A}$ and offset 76 (i.e., $l_{1A}$-offset). If row length $L_{n+1}$ is greater than $l_{1A}$-offset, top length $l_{(n+1)A}$ is set to equal $l_{1A}$-offset by step 240 and process 140 returns to step 226 to consider the next top length $l_{n*}$ in the same roof sheathing row. If, however, row length $L_{n+1}$ is not greater than $l_{1A}$-offset, then top length $l_{(n+1)A}$ is set to equal row length $L_{n+1}$ by step 242, and process 140 returns to decision step 230 to consider the next roof sheathing row $R_{n+1}$. The above process repeats itself until decision step 230 identifies a row length $L_n$ that is not greater than zero, at which point process 140 moves to step 234.

As indicated in steps 234 through 268, the process of computing every bottom length $bl_{n*}$ of FIG. 7 is similar to the above process for calculating every top length $l_{n*}$. Starting with row $R_1$, decision step 246 determines whether the row length $L_{n+1}$ of the next sheathing row (which for row $R_1$ is row length $L_2$), is greater than zero. If row length $L_{n+1}$ is not greater than zero, process 140 moves to step 250 and begins to compute the side widths $W_{n*}$ of FIG. 7. If, however, row length $L_{n+1}$ is greater than zero, decision step 248 determines whether n+1 is an even number. If n+1 is an even number, decision step 254 determines whether row length $L_{n+1}$ is greater than top length $l_{1A}$. If row length $L_{n+1}$ is greater than top length $l_{1A}$, then bottom length $bl_{nA}$ is set to equal top length $l_{1A}$ as indicated by step 260. If however, row length $L_{n+1}$ is not greater than top length $l_{1A}$, then bottom length $bl_{nA}$ is set to equal row length $L_{n+1}$ as indicated by step 258, and process 140 moves to step 262 to consider bottom length $bl_{(n+1)*}$ for the next sheathing row $R_{n+1}$. Returning to decision step 248, if n+1 is not an even number, decision step 252 determines whether row length $L_{n+1}$ is greater than $l_{1A}$-offset. If row length $L_{n+1}$ is greater than $l_{1A}$-offset, then bottom length $bl_{nA}$ is set to equal $L_{1A}$-offset, and process 140 moves to decision step 264 to consider the next bottom length $bl_{n(*+1)}$ in row $R_n$. If however, $L_{n+1}$ is not greater than $l_{1A}$-offset, then, as indicated in step 258, bottom length $bl_{nA}$ is set to equal row length $L_{n+1}$, and process 140 moves to step 262.

Decision step 264 determines whether the difference between row length $L_{n+1}$ and the sum of all proceeding bottom lengths in row $R_n$ is greater than 96 inches. If this difference is greater than 96 inches, then, as indicated in step 266, bottom length $bl_{n(*+1)}$ is set to equal 96 inches, and decision step 264 considers the bottom length for the next piece of roof sheathing in row $R_n$. If however the difference between row length $L_{n+1}$ and the sum of all proceeding bottom lengths in row $R_n$ is not greater than 96 inches, then step 268 sets bottom length $bl_{n(*+1)}$ to be equal to this difference, at which point process 140 returns to step 262 and considers the bottom lengths in the next sheathing row. The above process for computing bottom lengths $bl_{n*}$ of FIG. 7 continues until decision box 246 reaches a row length $L_{n+1}$ that is not greater than zero, at which point process 140 moves on to step 250.

As indicated above, steps 250 and steps 270 through 288 compute widths $W_{n*}$ of FIG. 7 starting with width $W_{1A}$ as indicated in step 250. Decision step 270 determines whether bottom length $bl_{nA}$ is greater than zero. If bottom length $bl_{nA}$ is greater then zero, width $W_{nA}$ is set to equal 48 inches by step 272. In this embodiment, 48 inches corresponds to the width of an uncut roof sheathing piece $S_{n*}$. In other embodiments, $W_{nA}$ may be set by the user or process 140 to any roof sheathing piece width known in the art. From step 272, process 140 moves to step 276 and considers the next roof sheathing piece $S_{n(*+1*)}$ in row $R_n$. If however, top length $bl_{na}$ is not greater then zero, width $W_{nA}$ is computed by step 174 to equal row length $L_n$ multiplied by 48 inches and divided by distance $\Delta L$ of FIG. 7, where 48 inches is the width of an uncut roof sheathing piece $S_{n*}$. Process 140 then moves from step 274 to step 276 and considers the next roof sheathing piece $S_{n(*+1)}$ in row $R_n$. Decision step 278 determines whether the difference between row length $L_n$ and the sum of all preceding top lengths in row $R_n$ is greater than distance $\Delta L$. If the difference computed in step 278 is greater than distance $\Delta L$, width $W_{n(*+1)}$ is set to equal to 48 inches by step 280, and process 140 returns to step 276 and considers the next sheathing piece $S_{n(*+1)}$ in row $R_n$. If, however, the difference between row length $L_n$ and preceding top lengths in row $R_n$ is not greater than distance $\Delta L$, decision step 282 determines whether this difference is greater than zero. If the difference is greater than zero, step 284 sets width $W_{n(*+1)}$ to equal the sum of all preceding top lengths in row $R_n$ multiplied by the ratio of 48 inches to distance $\Delta L$, and process 140 moves decision step 276. However, if decision step 282 determines the difference between row length $L_n$ and the sum of all preceding top lengths in row $R_n$ to be less than or equal to zero, decision step 286 then determines whether row length $L_n$ is greater than zero. If row length $L_n$ is greater then zero, then width $W_{n(*+1)}$ for the next row $R_{(n+1)}$ are calculated as indicated by step 288. This process continues moving from row to row down dormer roof 24 until decision step 286 reaches a row length $L_n$ that is not greater than zero. At this point, process 140 moves to step 290.

In decision step 290, the ratio of top length $l_{1*}$ of the innermost (relative to edge 32) piece of roof sheathing $S_{1*}$ in row $R_1$ to the length of an uncut piece of sheathing is determined and compared to the fraction ⅓. In the embodiment of FIG. 10, as indicated in step 290, the length of uncut roof sheathing piece $S_{n*}$ is set to equal 96 inches. In other embodiments, the length of the uncut roof sheathing may be any sheathing length known in the art. Decision step 290 determines this ratio for each roof sheathing offset 76 of steps 206 through 212. If the ratio for a particular roof sheathing offset 76 is not greater then ⅓, then that roof sheathing offset is not recommended as indicated in step 294. In other embodiments, the value that the ratio must exceed to be recommended by step 292 may vary depending upon the acceptable level of roof sheathing waste.

Decision step 296 determines whether a rake ladder detail as shown in FIG. 3 is to be included based on information inputted by input step 142. If a rake ladder detail is not required, nailer length $L_N$ is assigned a value of zero by step 298. If, however, a rake ladder detail is to be incorporated, nailer length $L_N$ is determined by step 300 using the calculation $(H_{VT1}+S_{MR} 1.5")P_D/S_D$, where 1.5 inches represents the width of nailer 58. In the embodiment of FIG. 10, a two-by-four is used as the starting material for nailer 58. In other embodiments, 1.5 inches may be replaced by the appropriate width of any nailer material known in the art. If a rake ladder detail is to be incorporated length $L_{LO}$ (shown in FIGS. 3 and 4) is computed in step 308 using the formula $L_{LO}=L_{GO}+(H_G-H_{VT1})/S_{MR}$. If a rake ladder detail is not to be incorporated, step 302 determines whether the fascia thickness is equal to 1.5 inches based on the relevant input in step 142. If the fascia thickness is not 1.5 inches, step 304 computes length $L_{LO}$ to be $L_{GO}-(1.5"+$wall sheathing thickness$)$, where the wall sheathing thickness is the thickness of wall sheathing 62 of FIG. 4. If however, the thickness of fascia F is not equal to 1.5 inches, step 306 then carries out the same calculation as in step 304 using the thickness of fascia F inputted in step 142. If a rake ladder detail is to be incorporated in dormer 20, step 310 determines whether the thickness of fascia F is equal to 1.5 inches. If the thickness is not equal to 1.5 inches then the final cut length $L_{LO}$ is given in step 314 by subtracting the thickness of fascia F from input step 142 from the value obtained in step 308. If the thickness of fascia F is equal to 1.5 inches, then step 312 subtracts three inches from the preliminary length $L_{LO}$ determined by step 308 to yield the final cut length $L_{LO}$, where three inches represents the sum of the fascia thickness and the thickness of nailer 58.

If fascia F is to be cantilevered out, fascia length $L_F$ is computed in step 320 using the calculation $L_F=(S_{MR}(L_{GO}+1.5")+P_{MR}($roof sheathing thickness$))\cdot P_D/S_D$. For a non-cantilevered fascia F, step 318 computes fascia length $L_F$ using the formula $(L_{GO}S_{MR}+H_G)\cdot P_D/S_D$. Then, in a final step, step 322 outputs to a user fascia length $L_F$, nailer length $L_N$ (if applicable), length $L_{LO}$, a roof sheathing cut pattern, one or more recommended roof sheathing cut patterns, and the spacing of gable truss GT and valley trusses 42 along valley-line 34.

The dormer calculator described above with respect to exemplary embodiments of the present invention provides a systematic method for laying out the framing and the roof sheathing for a dormer projecting outward from a main roof. The locations of the dormer trusses with respect to the main roof are determined using a plurality of dormer inputs received from a user to generate a gable truss spacing and a uniform valley truss spacing. The gable truss spacing and the uniform valley truss spacing are used to determine the location of each dormer truss along the pair of valley-lines where the dormer meets the main roof. Based on these dormer truss locations, a plurality of roof sheathing layouts are determined, with each roof sheathing layout including a quantity of roof sheathing pieces to be installed on the dormer roof and cut dimensions for each piece of roof sheathing. The dormer calculator then recommends at least one of the roof sheathing layouts to a user. As such, a dormer installer using the present invention can make all of the dormer roof sheathing cuts and placement decisions while on the ground, thereby saving time, reducing roof exposure time, and eliminating the need for removing roof sheathing waste from the roof.

Another embodiment of the present invention relates to a method for producing a dormer template or underlay. The dormer template is attachable onto a main roof to aid in formation of the dormer structure. Utilizing a method similar to the dormer layout method described above, the dormer template is formed with dimensions that locate the dormer trusses in correct positions. In an exemplary embodiment, the dormer template is materially formed dimensionally (that is, formed of inexpensive building materials such as paper/fabric or plywood, for example, that is not designed to be load-bearing), with sufficient structural integrity to bear the reaction forces applied by the dormer trusses that are attached to it. The load of the dormer trusses is supported by the main roof support. In a particular embodiment, the dormer template has a thickness of about 1.5 inches. Alternatively, the dormer template may be formed of a structural material that becomes a part of the structural design of the dormer. Also, in some embodiments, the main roof sheathing under the dormer roof may be eliminated by virtue of the dormer template being constructed to replace the functions of the main roof sheathing in that location.

Figure 11A:
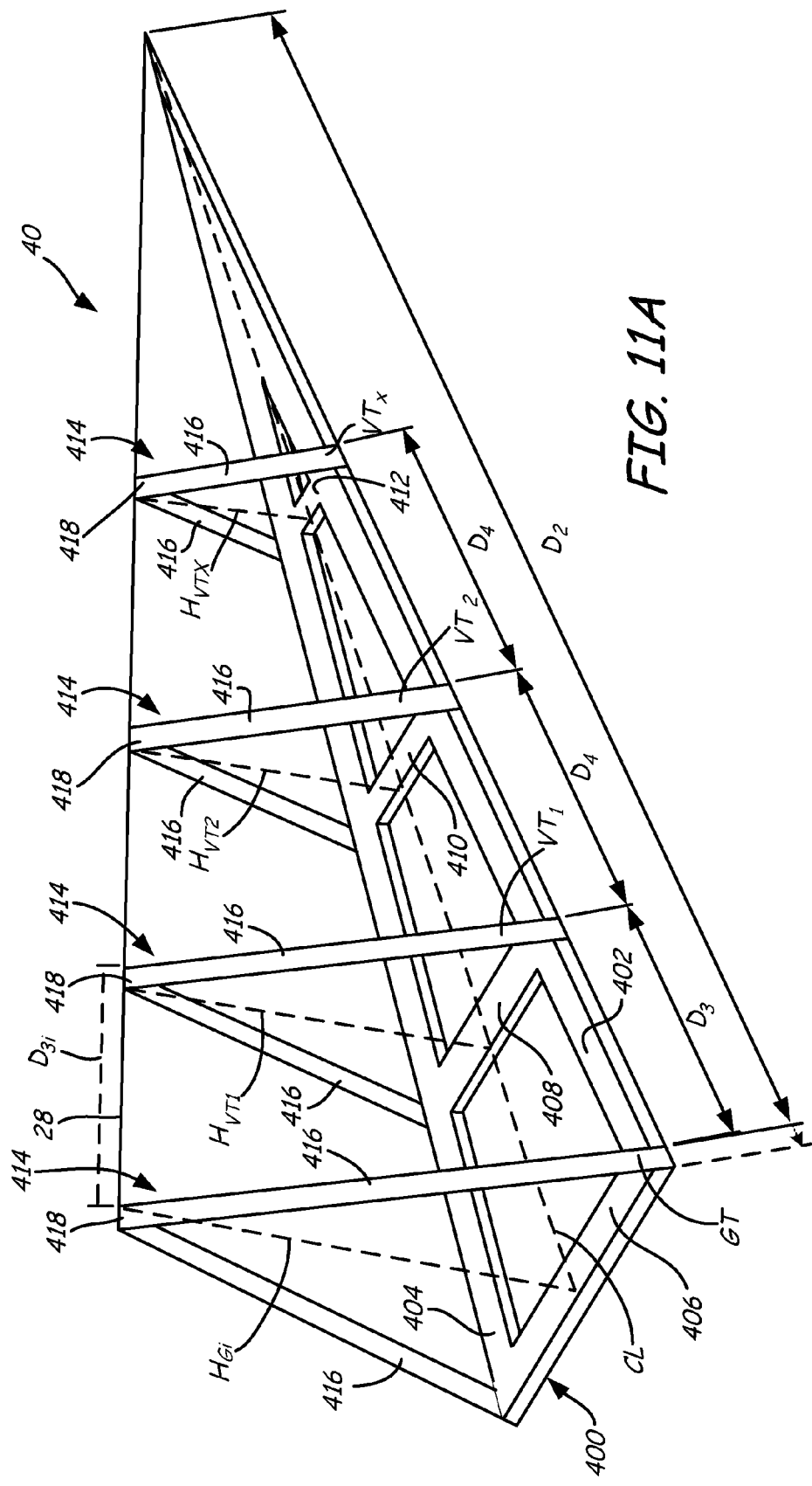
FIG. 11A is a simplified perspective view.
Figure 11B:
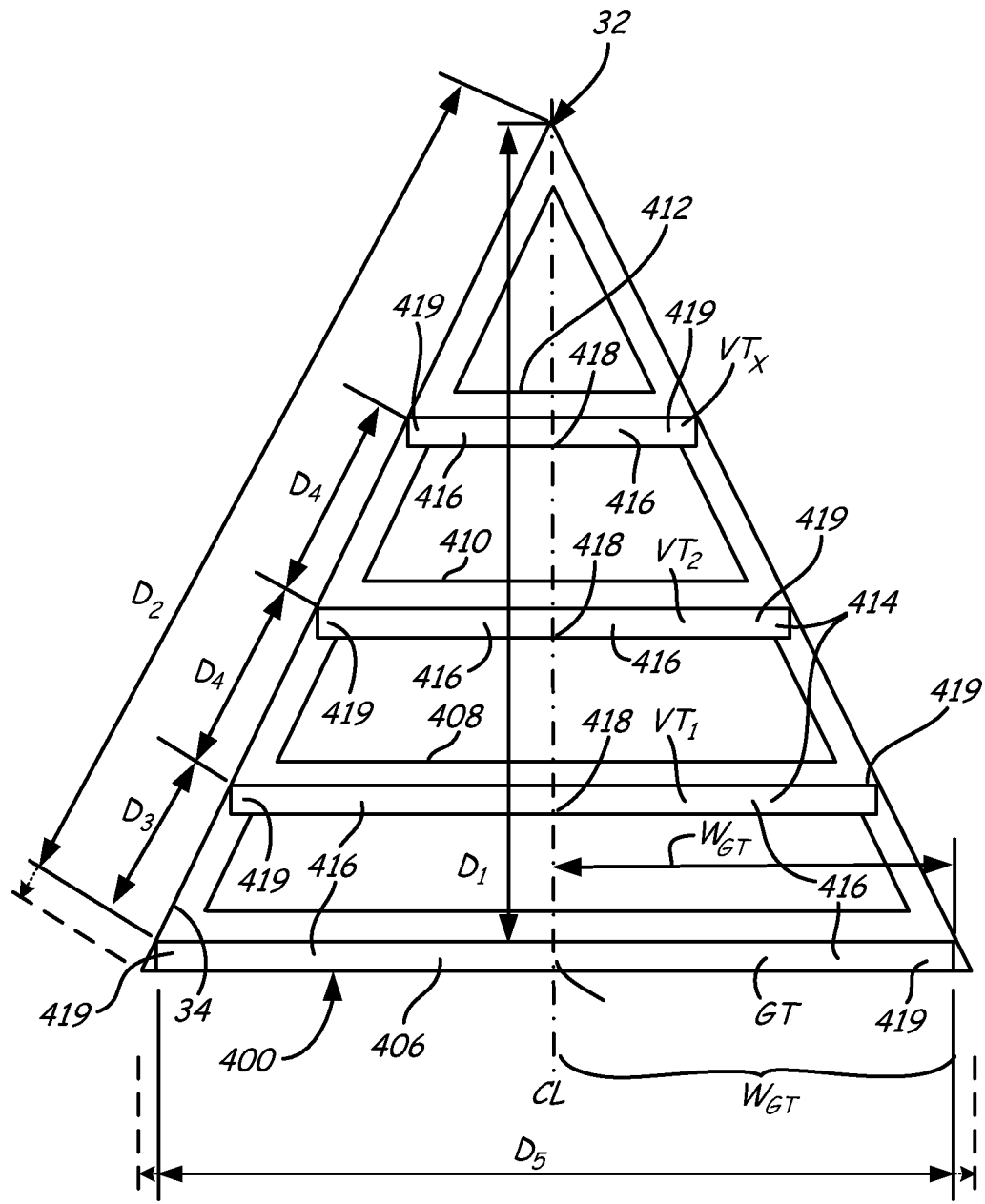
FIG. 11B is a simplified top view, showing a dormer template for forming dormer framing.

FIGS. 11A and 11B are simplified diagrams showing dormer template 400 for forming dormer framing 40 according to an embodiment of the present invention, with FIG. 11A showing a simplified perspective view and FIG. 11B showing a simplified top view. Dormer template 400 includes side pieces 402 and 404 and cross pieces 406, 408, 410 and 412. Side pieces 402 and 404 converge at center line CL to form two sides of a triangle, with cross piece 406 forming the base of the triangle. Cross pieces 406, 408, 410 and 412 mark the location on which dormer trusses 414 are to be attached. Specifically, rafters 416 forming gable truss GT are located on side pieces 402 and 404 of dormer template 400 at opposite ends of cross piece 406, and rafters 416 forming valley trusses VT1, VT2 and VT3 are located on side pieces 402 and 404 of dormer template 400 at opposite ends of cross pieces 408, 410 and 412, respectively. Rafters 416 of gable truss GT and valley trusses VT1, VT2 and VT3 are joined at truss peak 418, and are configured and spaced in generally the same manner as shown and described above with respect to FIGS. 2A and 2B.

Dimensions $D_2$ and $D_5$ of dormer template 400 are shown in solid lines for a configuration in which a non-zero heel height exists. If there is no heel (that is, if the heel height is zero), dimensions $D_2$ and $D_5$ of dormer template 400 extend as shown in dashed lines in FIGS. 11A and 11B.

With the provision of dormer template 400, the entire dormer framing 40 may be a premanufactured product that can be assembled at a factory or in the field. Notably, the layout of the dormer that has traditionally been a task for a worker at the construction site, is predetermined by the dormer template, so that the worker at the construction site need only assemble dormer framing 40 on dormer template 400 and/or attach dormer framing 40 to the main roof.

As described above with respect to FIGS. 3 and 4, multiple framing variations are employed in the dormer construction industry for attaching fascia F to dormer framing 40. FIG. 3 shows dormer framing 40 with a rake ladder detail, and FIG. 4 shows dormer framing 40 without a rake ladder detail. In each of these embodiments, dormer template 400 may, in an exemplary configuration, be constructed so that distance between fascia F and first valley truss $VT_1$ is calculated to be equal to the spacing between the other valley truss rafters.

Figure 12:
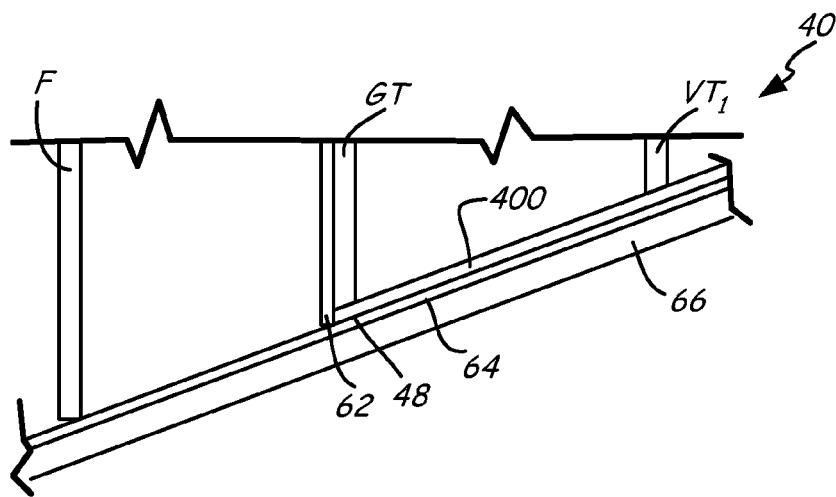
FIGS. 12 and 13 are partial side views of framing variations for dormer framing.
Figure 13:
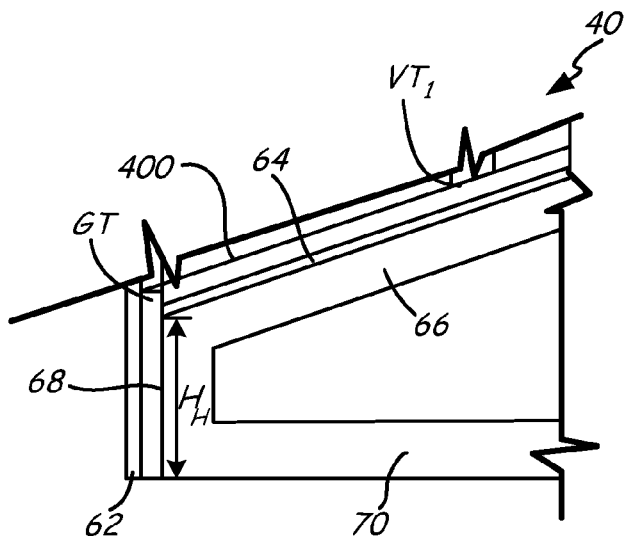

FIGS. 12 and 13 are partial side views of framing variations for dormer framing 40. FIGS. 12 and 13 are substantially identical to FIGS. 5 and 6 discussed above, except that FIGS. 12 and 13 incorporate dormer template 400, positioned on main roof sheathing 64.

Figure 14:
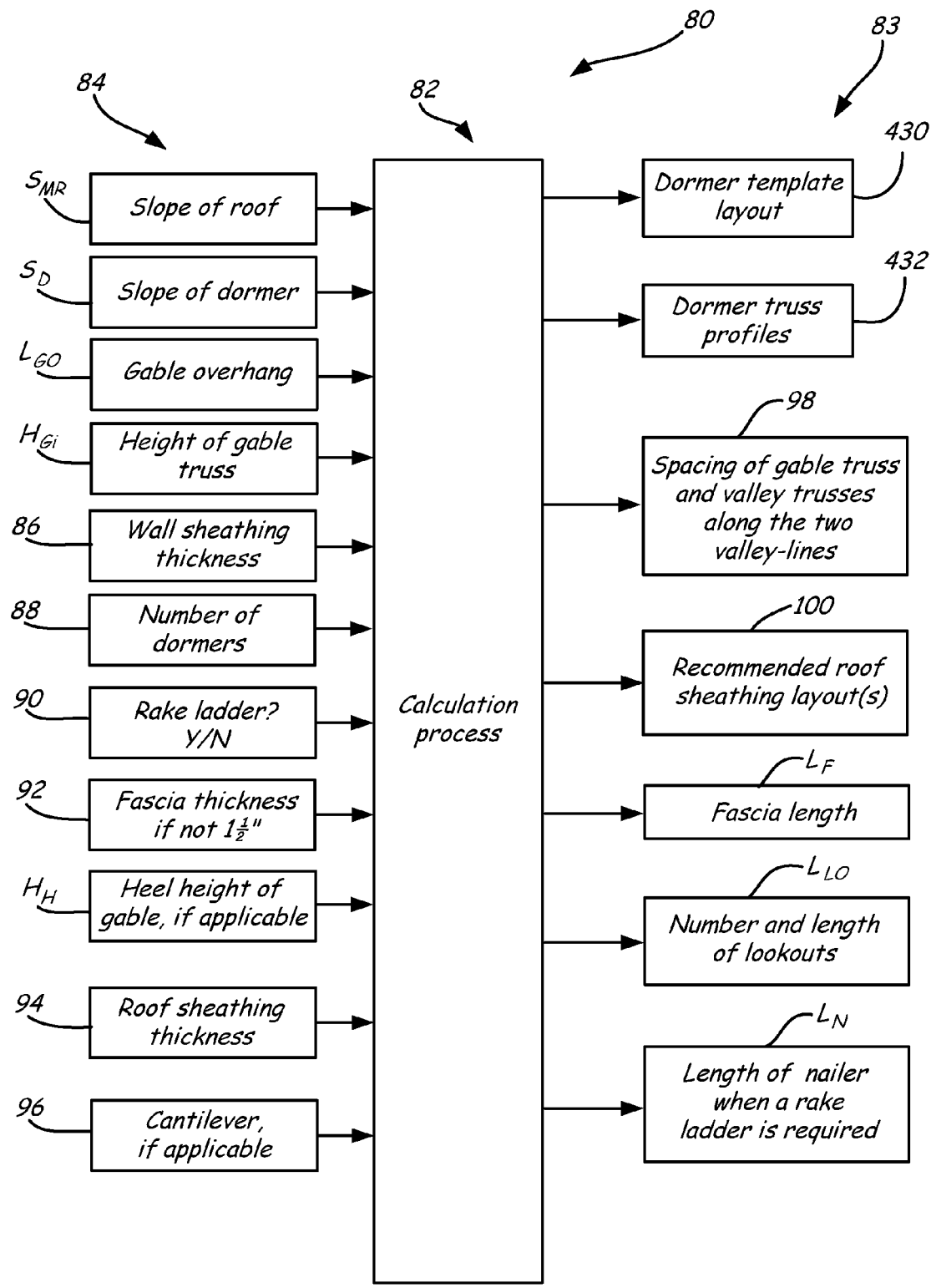
FIG. 14 is a block diagram illustrating an embodiment of a dormer calculator that incorporates creation of a dormer template.

FIG. 14 is a block diagram illustrating an embodiment of dormer calculator 80 that incorporates the creation of dormer template 400. The diagram shown in FIG. 14 is substantially identical to FIG. 8 discussed above, except that one dormer input 84 to calculation process 82 is removed and two additional dormer outputs 83 are generated by calculation process 82. Specifically, input $H_{VT1}$ (the height of the first valley truss) is no longer an option to be provided to calculation process 82, and calculation process 82 generates dormer template layout 430 and dormer truss profiles 432 as additional outputs. An exemplary process for generating these outputs is described in detail below.

Figure 15:
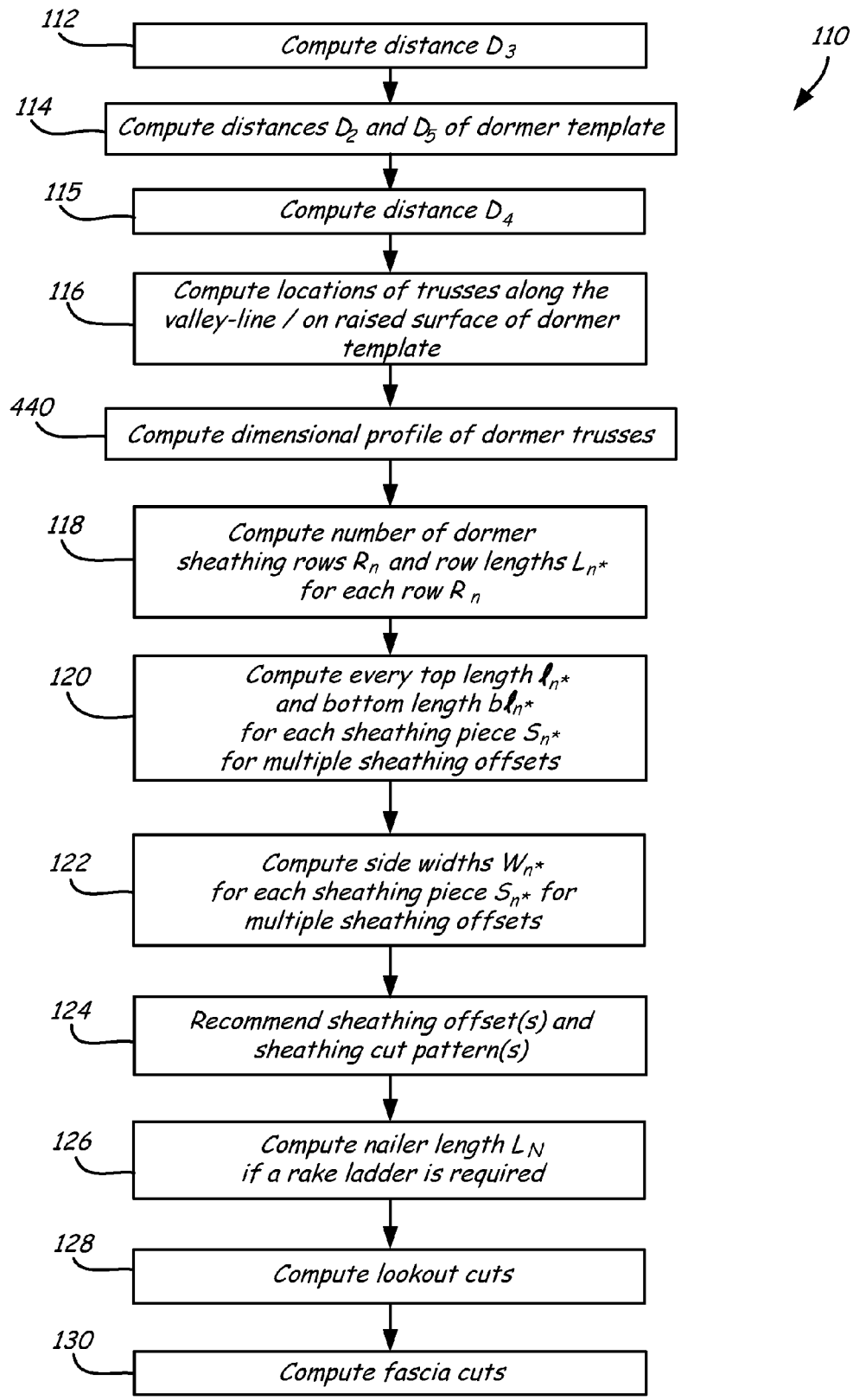
FIG. 15 is a flow diagram illustrating a calculation process for use in the method of FIG. 14.

FIG. 15 is a flow diagram illustrating calculation process 110 that incorporates the creation of dormer template 400, which is an embodiment of calculation process 82 of FIG. 14. The diagram shown in FIG. 15 is substantially identical to FIG. 9 discussed above, except that steps 114 and 116 are modified to account for the creation of dormer template 400, and new step 440 is added after step 116 for computation of the dimensional profile of dormer trusses 414. Specifically, step 114 is modified to indicate that distances $D_2$ and $D_5$ are both computed for dormer template 400 (see FIG. 11A). Step 116 is modified to indicate that the locations of trusses are computed along the valley line and/or on the raised surface of dormer template 400. Step 440 is added after step 116, and involves computing the dimensional profile of dormer trusses 414. The remaining steps are the same as described above with respect to FIG. 9.

The calculation process involving the creation of dormer template 400 receives as an input the roof height above the plane of the main roof at its heel ($H_{Gi}$), and then utilizes the main roof slope ($S_{MR}$) and the dormer slope ($S_D$) to determine the inner point of the dormer roof where it meets the main roof, which is known as the dormer point. From the dormer point, two lines are formed along the intersections of the dormer roof and the main roof to configure the outline of the dormer on the main roof. Dormer template 400 is formed with dimensional material (e.g., 1.5 inches in thickness in one embodiment) comprising side pieces 402 and 404 around the perimeter of the dormer outline, and the heights of dormer trusses 414 (i.e., rafters 416 forming valley trusses $VT_1$, $VT_2$ and $VT_3$) are calculated to establish a location for each to fit into the dormer and form the dormer's ridge line. The locations of dormer trusses 414 are marked on dormer template 400. In the embodiment shown in FIGS. 11A and 11B, these locations are marked by cross pieces 408, 410 and 412.

FIG. 16 (including FIGS. 16A-16K) is a flow diagram illustrating calculation process 140, which is a detailed embodiment of calculation process 110 of FIG. 15, for generating dormer outputs 83 as a function of dormer inputs 84 and incorporating the creation of dormer template 400. The diagram shown in FIGS. 16A-16K is substantially identical to FIGS. 10A-10K discussed above, except as discussed in detail below.

Figure 16A:
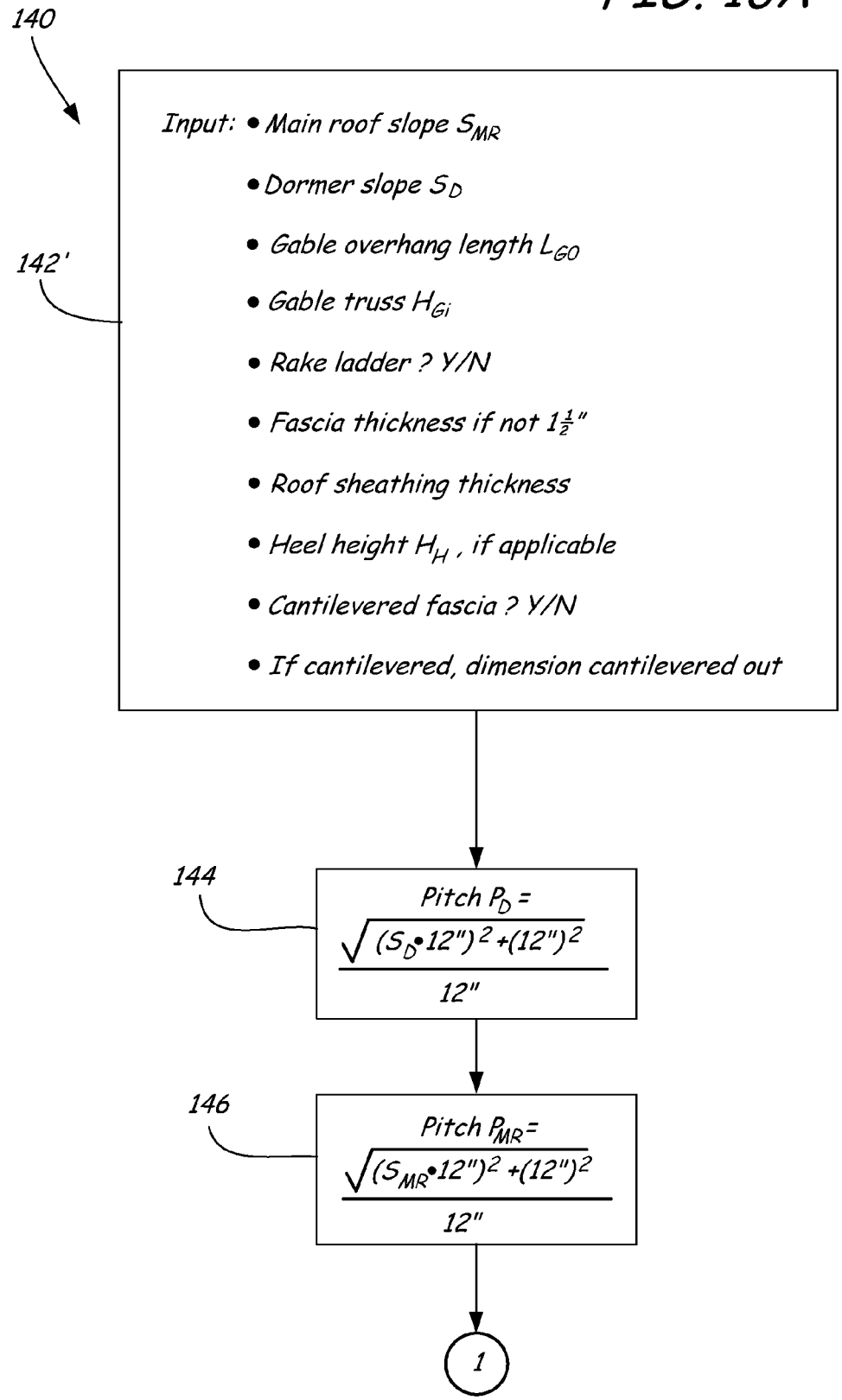

In FIG. 16A, step 142' shows the inputs to the calculation process. Step 142' differs from step 142 shown in FIG. 10A in that valley truss height $H_{VT1}$ is no longer included in the input list. This is because the calculation process for creation of dormer template 400 produces valley truss height $H_{VT1}$ based on other variables, and is not a fixed input to the process. However, in an exemplary embodiment, a slider bar is created in a user interface to the calculation process (typically a computer running an application that includes the calculation process), with the slider being movable to the right or left to see the effects of changing valley truss heights and roof sheathing layouts. This feature allows the calculation process to be used either to work with prefabricated valley trusses, or to be used to show other possible dimensions of valley trusses which will optimize roof sheathing layouts.

Figure 16B:
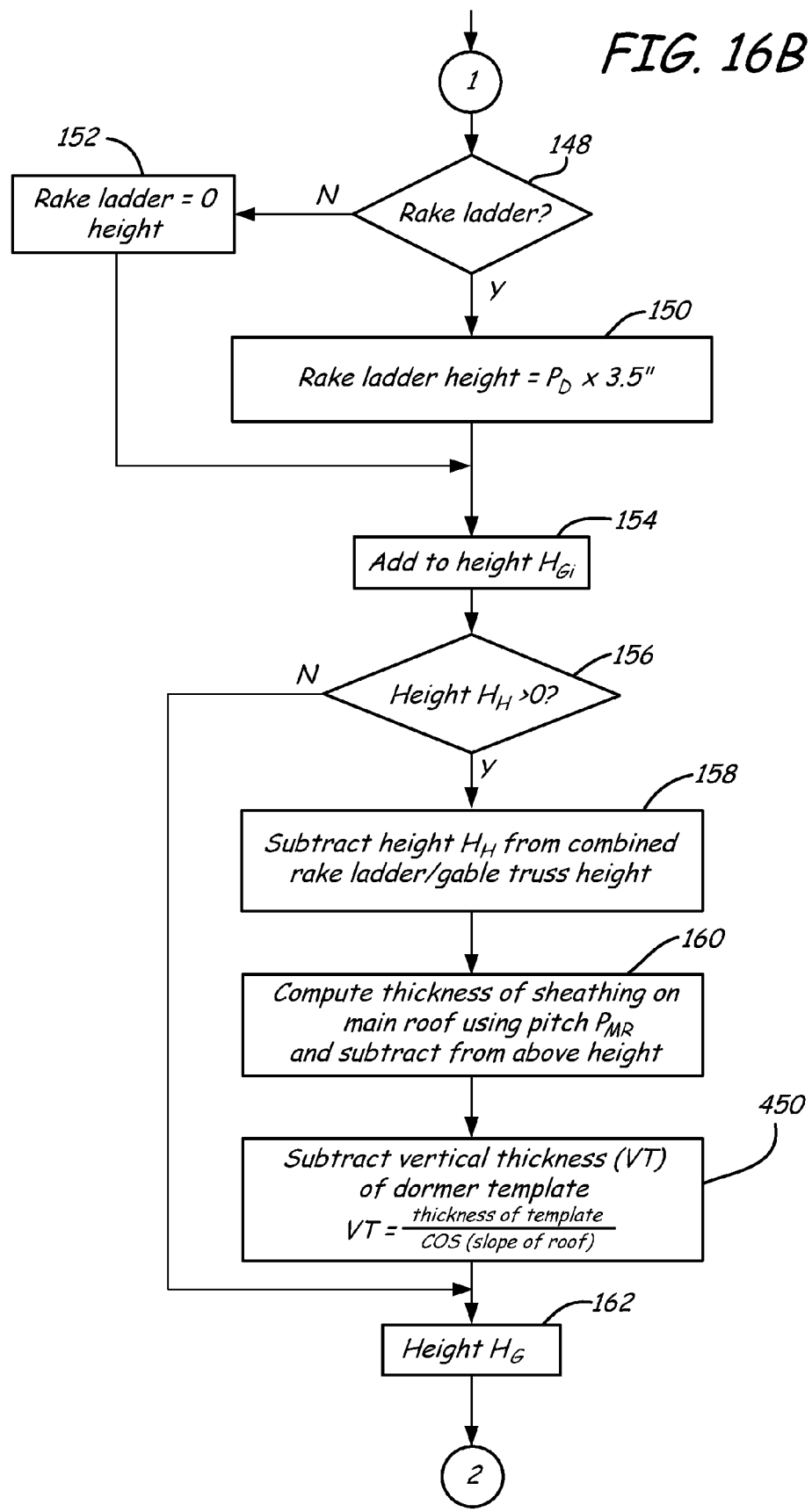

In FIG. 16B, step 450 is added after step 160 to subtract the vertical thickness (VT) of dormer template 400 from the overall height calculation, since dormer template 400 will be located so as to underlay the dormer trusses. VT is determined by dividing the thickness of the template by the cosine of the angle of the slope of the main roof.

In FIG. 16C, step 460 is added after step 170 to calculate the height of valley truss VT1. As discussed above with respect to FIG. 16A, this height is not a fixed input to the calculation process in the embodiment involving creation of a dormer template 400 (although, as discussed above, a slider bar may be added to show calculations of various valley truss heights and roof sheathing layouts to allow the user to see the effects of changes in those parameters on one another).

Figure 16D:
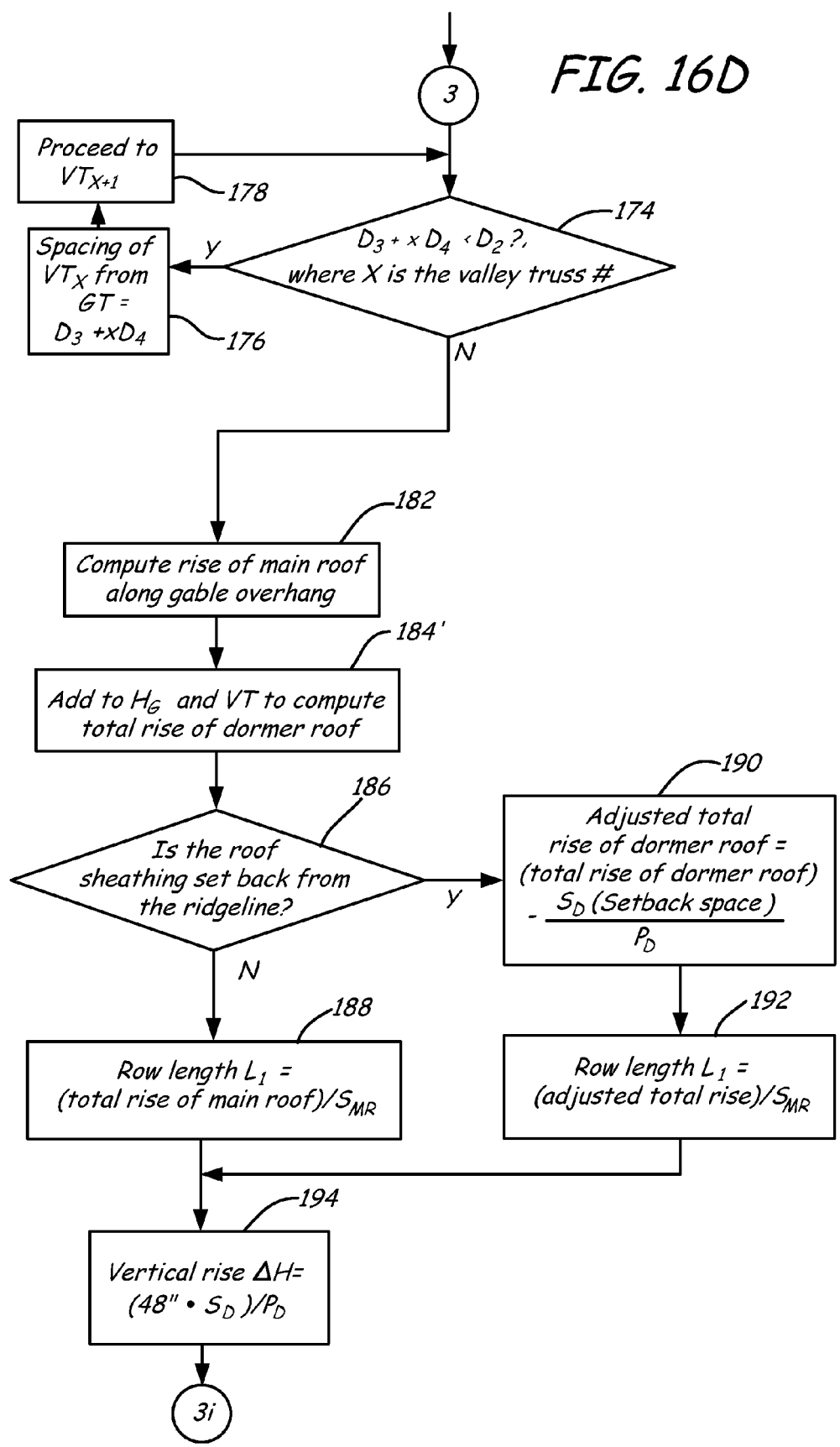
Figure 16E:
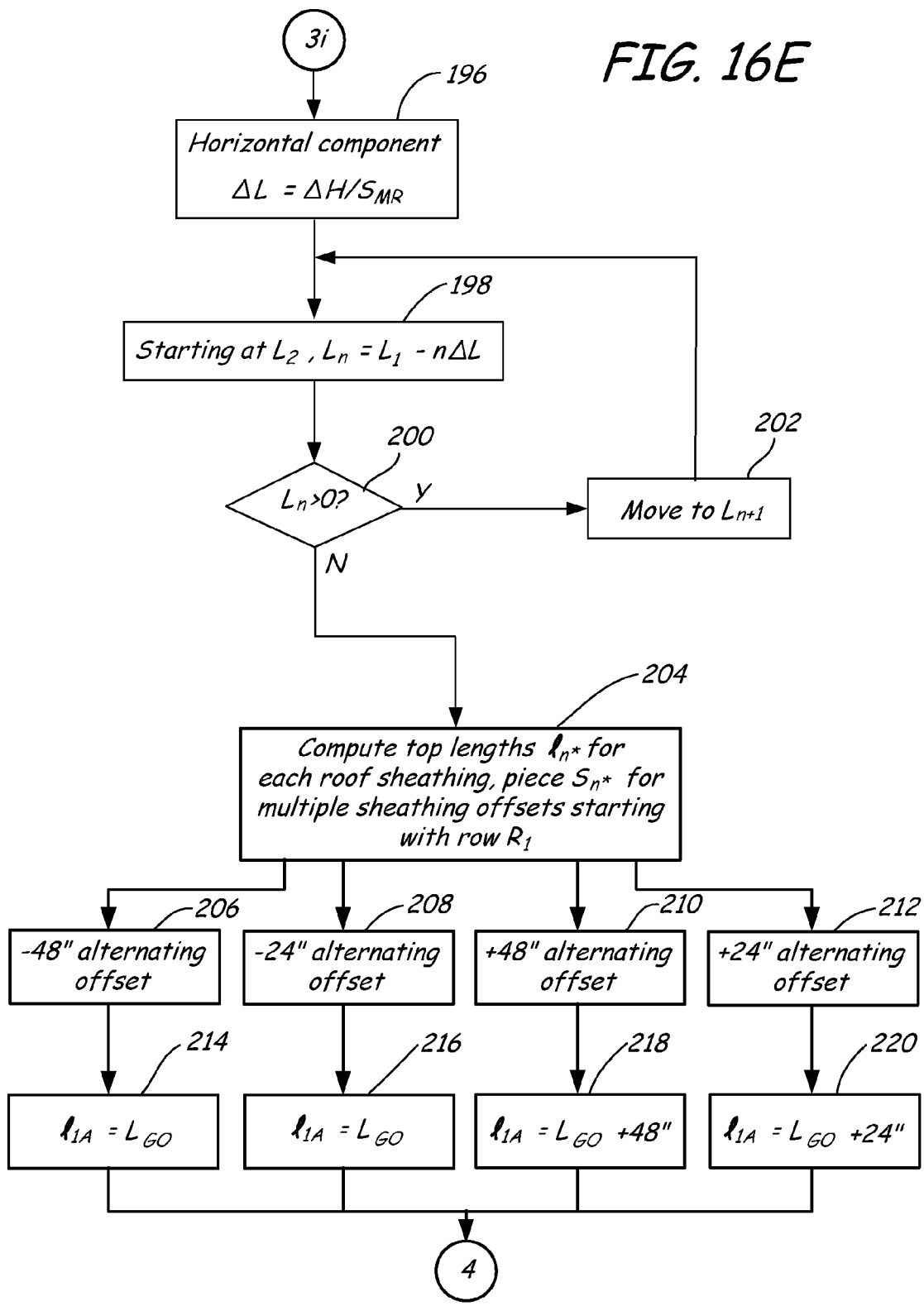
Figure 16F:
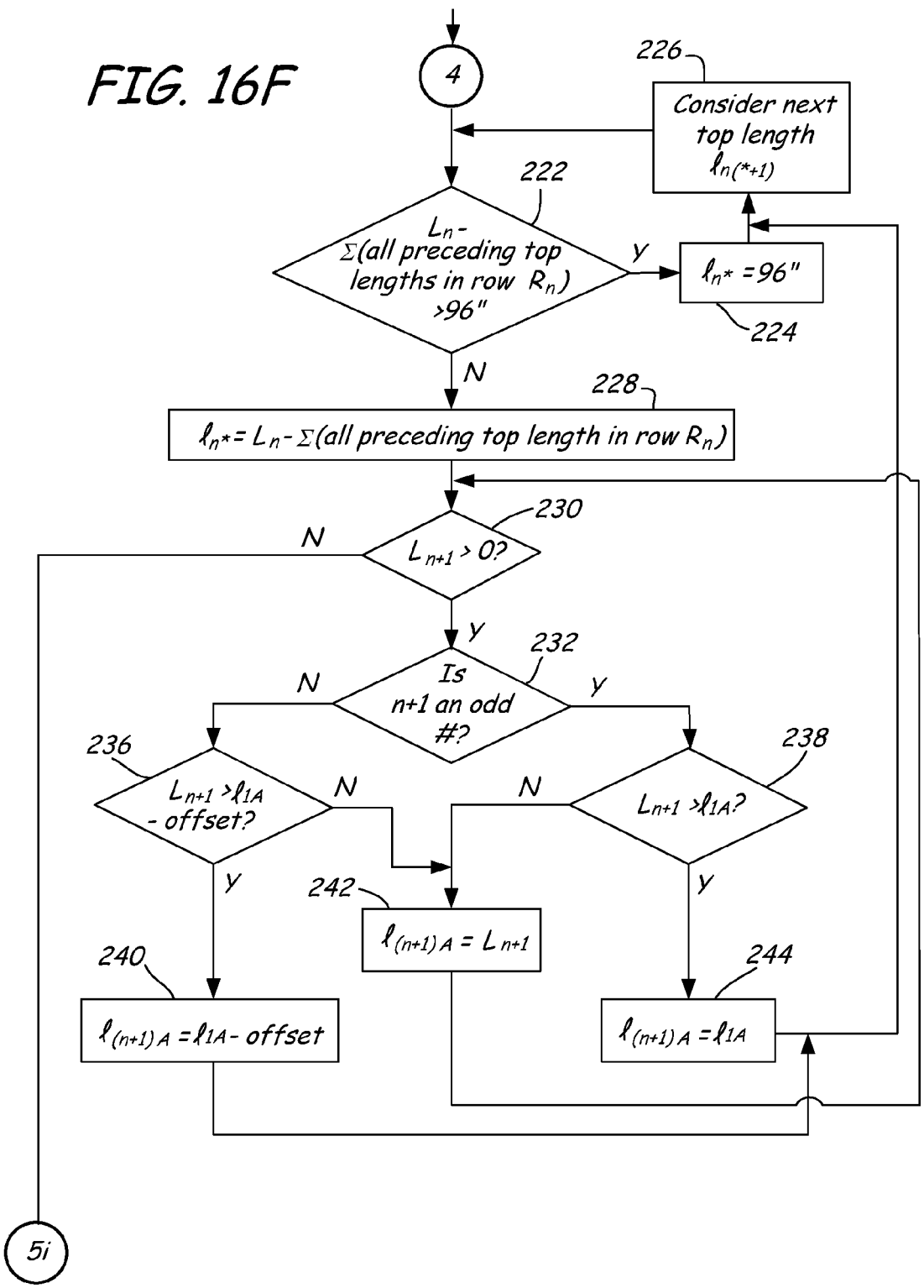
Figure 16G:
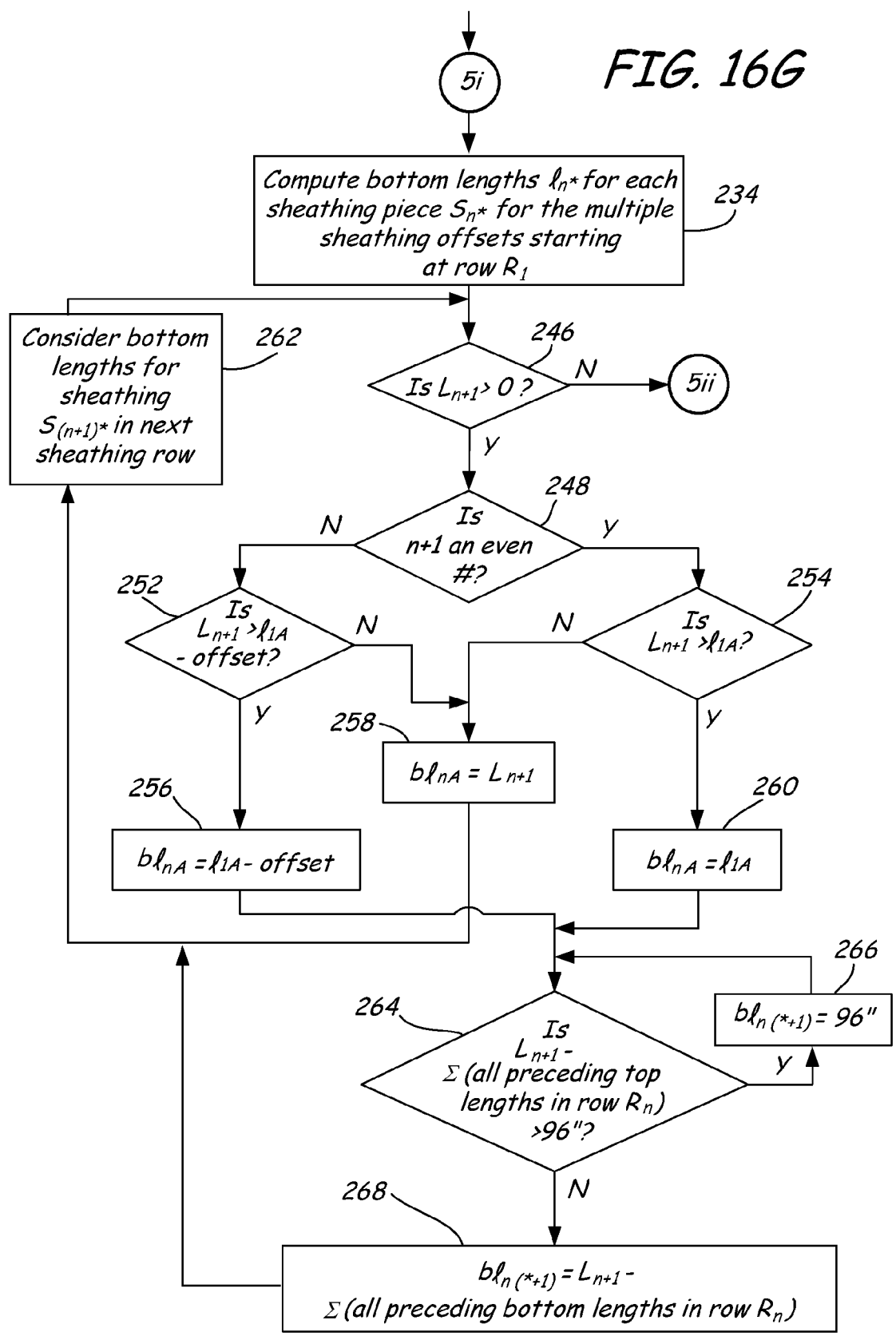
Figure 16H:
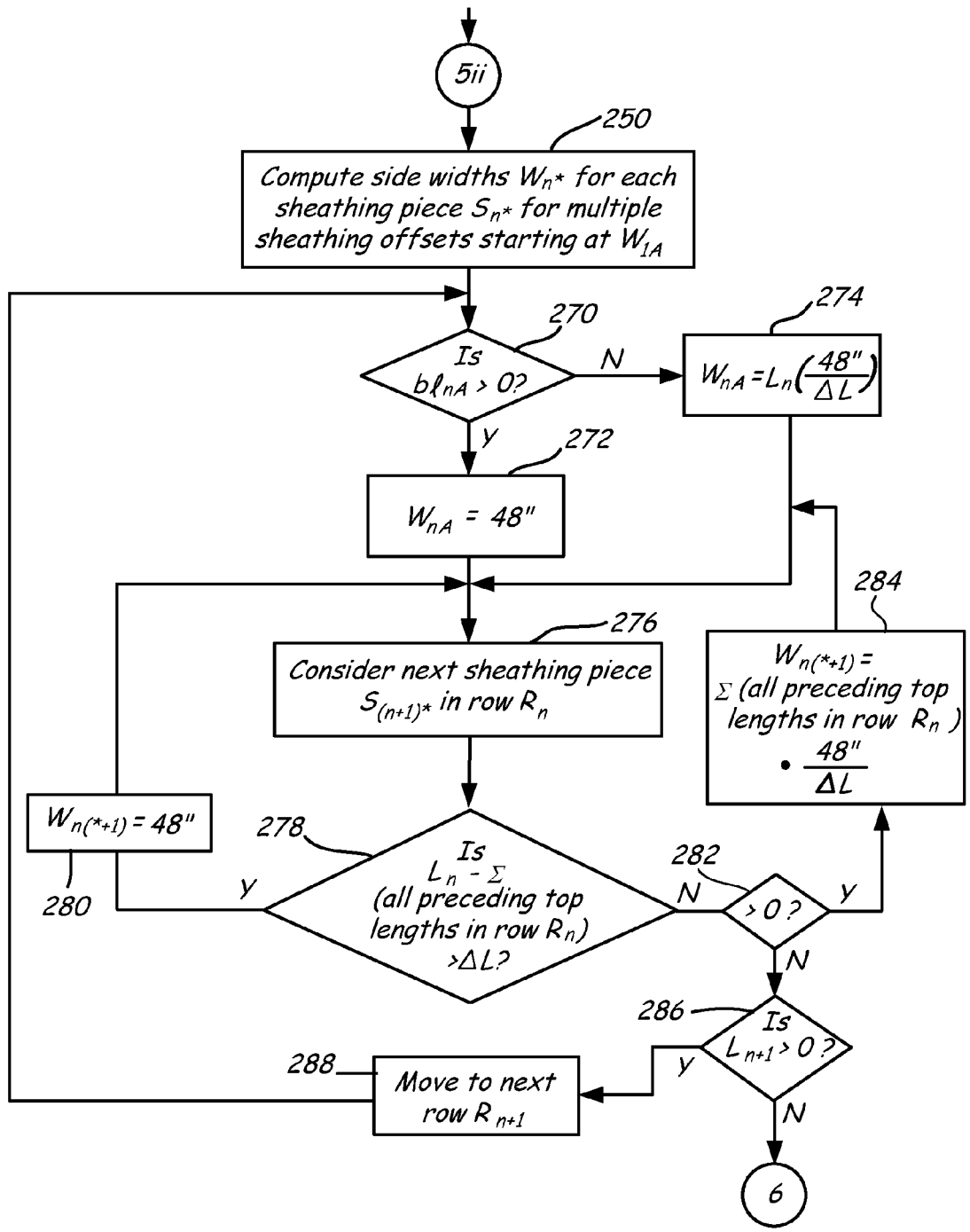
Figure 16I:
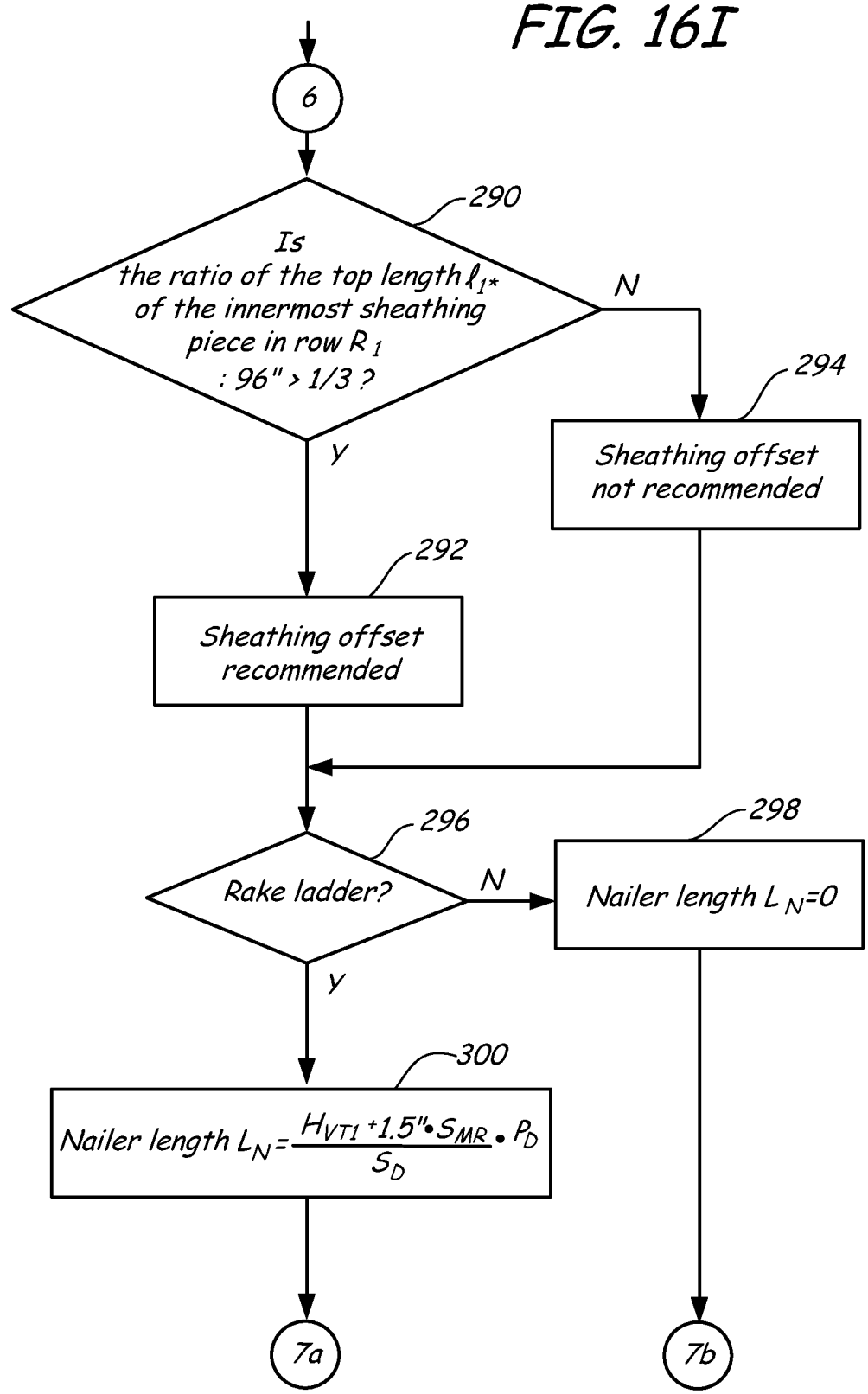
Figure 16J:
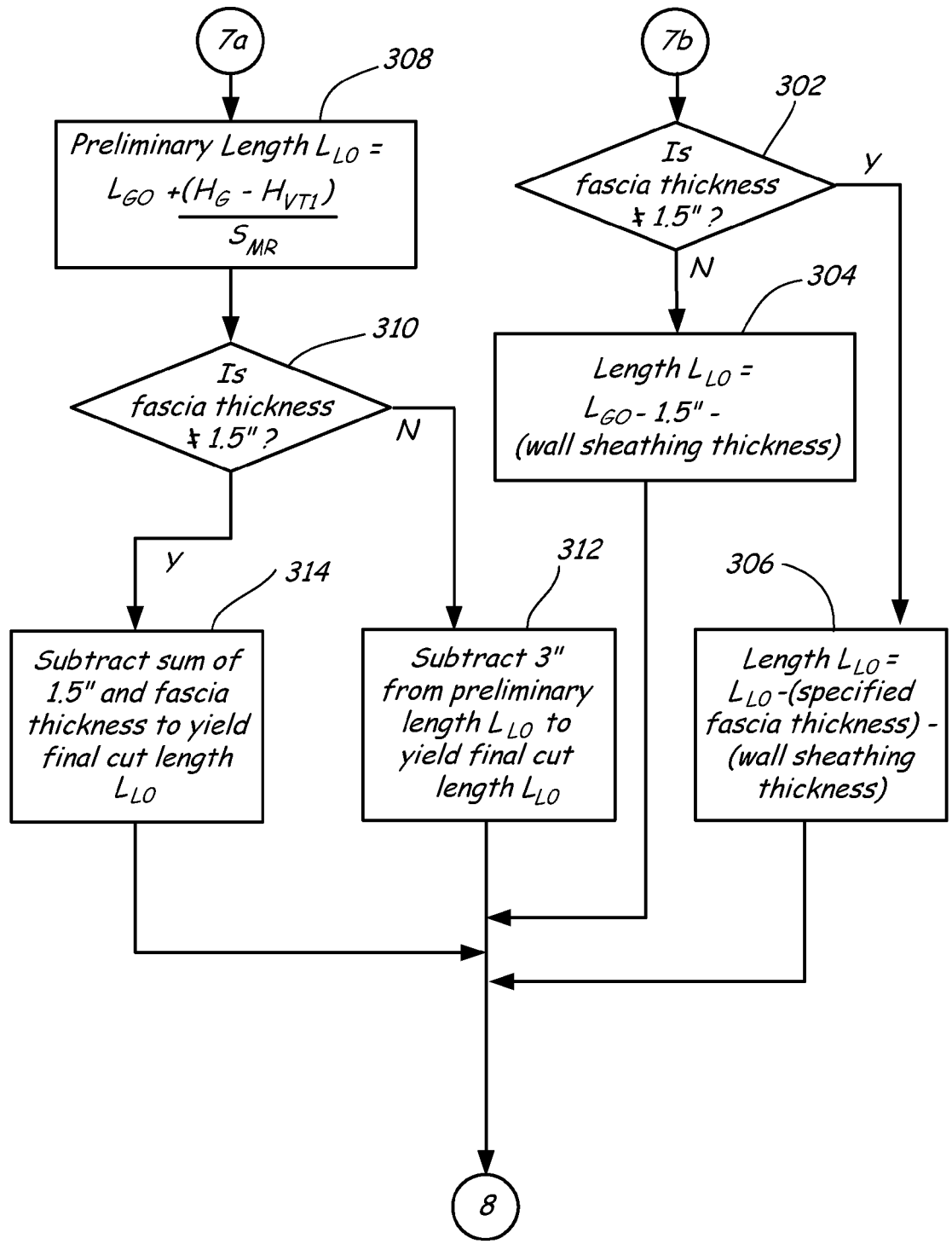

In FIG. 16D, step 184' is modified to add back in the vertical thickness (VT) of dormer template 400 when calculating the total rise of the dormer roof (since this number was subtracted from the earlier calculation of height $H_G$, but does add to the total rise of the dormer roof).

In FIG. 16K, step 322' shows the outputs of the calculation process. In step 322', the dimensional profile of the dormer trusses and the dormer template dimensions are added (compared to step 322 shown in FIG. 10K), to indicate that these outputs are generated by the process that involves creation of dormer template 400.

As a result of the process shown in FIGS. 16A-16K, the dimensions of dormer template 400 and dormer trusses 414 are generated, and dormer template 400 is subsequently constructed accordingly. Dormer template 400 provides visual indicators of the locations of dormer trusses 414, which may also be premanufactured so that the entire dormer can be assembled either in a factory or in the field with no layout required by the assembler at the construction site.

Although the present invention has been described with reference to preferred embodiments, workers skilled in the art will recognize that changes may be made in form and detail without departing from the spirit and scope of the invention.

The invention claimed is:

1. A method for recommending a roof sheathing layout for a dormer projecting outward from a main roof, the dormer having a roof constructed from roof sheathing supported by dormer trusses, the method comprising:

receiving a plurality of dormer inputs from a user, the
dormer inputs including at least one of a main roof slope, a dormer slope, a gable overhang length, a gable truss height, a valley truss height, a wall sheathing thickness, an input representing the total number of dormers to be constructed, an input representing whether a rake ladder detail will be included in the dormer, an input representing the fascia thickness, a heel height, an input representing the roof sheathing thickness of the main roof, and an input indicating whether a cantilevered fascia is to be included in the dormer;

generating a plurality of layouts for the roof sheathing on the dormer roof as a function of the dormer inputs, each of the plurality of layouts comprising a different roof sheathing offset distance for neighboring rows of roof sheathing; and recommending at least one roof sheathing layout to a user.

2. The method of claim 1, wherein each roof sheathing layout includes a location for each piece of roof sheathing on the dormer roof.

3. The method of claim 1, wherein each roof sheathing layout indicates a cut dimension for each piece of roof sheathing.

4. The method of claim 1, further comprising:
generating a location of each dormer truss along the main roof as a function of the dormer inputs.

5. The method of claim 1, wherein the dormer inputs comprise:
the dormer slope;
the main roof slope;
the gable truss height; and
the first valley truss height.

6. The method of claim 5, wherein the plurality of dormer inputs further comprise the gable overhang distance.

7. The method of claim 5, wherein a plurality of roof sheathing row lengths are generated using the dormer slope, the main roof slope, and the gable truss height, the plurality of roof sheathing layouts generated as a function of the roof sheathing row lengths.

8. The method of claim 7, wherein each roof sheathing layout includes cut dimensions for each piece of roof sheathing, the cut dimensions including a top length, a bottom length, and a side width.

9. The method of claim 1, wherein the at least one roof sheathing layout is recommended as a function of a ratio of a top length of an innermost piece of roof sheathing to a length of an uncut piece of roof sheathing, the innermost piece of roof sheathing located in a roof sheathing row nearest to a dormer ridgeline.

10. A method for determining locations of dormer trusses with respect to a main roof, the dormer trusses supporting a dormer projecting outward from the main roof along a pair of valley lines originating from a dormer point, the dormer trusses comprising a gable truss and a plurality of valley trusses, the method comprising:

receiving a plurality of dormer inputs from a user, the dormer inputs including a gable truss height, a valley truss height, a main roof slope, and a dormer roof slope;

processing the dormer inputs to generate a gable truss spacing for spacing the gable truss from a first valley truss and a uniform valley truss spacing for spacing neighboring valley trusses from each other, wherein the gable truss spacing is the spacing between the gable truss and the first valley truss along the pair of valley lines and is determined as a function of the gable truss height, the valley truss height, the main roof slope, and the dormer roof slope, and the uniform valley truss spacing is determined along the pair of valley lines as a function of the main roof slope, the dormer roof slope, and a known uniform spacing distance for spacing neighboring valley trusses from each other along a ridgeline of the dormer;

determining the locations of the dormer trusses using the gable truss spacing and the uniform valley truss spacing; and displaying the location of each dormer truss to a user.

11. The method of claim 10, wherein the location of each dormer truss comprises a location along the pair of valley lines.

12. The method of claim 10, wherein the dormer inputs further comprise:
at least one of a gable overhang length, a wall sheathing thickness, an input representing the total number of dormers to be constructed, an input representing whether a rake ladder detail will be included in the dormer, an input representing the fascia thickness, a heel height, an input representing the roof sheathing thickness of the main roof, and an input indicating whether a cantilevered fascia is to be included in the dormer.

13. The method of claim 10, wherein determining the location of each dormer truss comprises:
generating a gable truss location along the pair of valley lines relative to the dormer point as a function of the dormer roof slope, the main roof slope, and the valley truss height, the gable truss location separated from the dormer point along the pair of valley lines by a dormer point spacing;
generating a first valley truss location along the pair of valley lines as a function of the gable truss spacing and the gable truss location; and
generating at least one next valley truss location as a function of the uniform valley truss spacing and the first valley truss location, the next valley truss location located along the pair of valley lines closer to the dormer point relative to a preceding valley truss location; and
continuing to generate the next valley truss location until the next valley truss location is separated from the dormer point along the pair of valley lines by a distance equal to the uniform valley truss spacing.

\* \* \* \* \*